United States Patent
Hudson et al.

(10) Patent No.: US 9,543,148 B1
(45) Date of Patent: *Jan. 10, 2017

(54) MASK SHRINK LAYER FOR HIGH ASPECT RATIO DIELECTRIC ETCH

(71) Applicant: Lam Research Corporation, Fremont, CA (US)

(72) Inventors: Eric A. Hudson, Berkeley, CA (US); Mark H. Wilcoxson, Oakland, CA (US); Kalman Pelhos, San Jose, CA (US); Hyunjong Shim, San Ramon, CA (US); Merrett Wong, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/842,733

(22) Filed: Sep. 1, 2015

(51) Int. Cl.
| | |
|---|---|
| *H01L 21/311* | (2006.01) |
| *H01L 21/3065* | (2006.01) |
| *H01L 21/033* | (2006.01) |
| *H01L 21/67* | (2006.01) |
| *H01J 37/32* | (2006.01) |

(52) U.S. Cl.
CPC ....... *H01L 21/0338* (2013.01); *H01J 37/3244* (2013.01); *H01J 37/32366* (2013.01); *H01L 21/0332* (2013.01); *H01L 21/0335* (2013.01); *H01L 21/0337* (2013.01); *H01L 21/31116* (2013.01); *H01L 21/31144* (2013.01); *H01L 21/67069* (2013.01); *H01J 2237/334* (2013.01)

(58) Field of Classification Search
None
See application file for complete search history.

(56) References Cited

U.S. PATENT DOCUMENTS

| 4,894,696 A | 1/1990 | Takeda |
| 5,767,018 A * | 6/1998 | Bell .................. H01L 21/32139 257/E21.31 |
| 5,948,704 A | 9/1999 | Benjamin et al. |
| (Continued) | | |

OTHER PUBLICATIONS

Briggs et al., "Technique to Deposit Sidewall Passivation for High Aspect Ratio Cylinder Etch," U.S. Appl. No. 14/560,414, filed Dec. 4, 2014.

(Continued)

*Primary Examiner* — Shamim Ahmed
(74) *Attorney, Agent, or Firm* — Weaver Austin Villeneuve & Sampson LLP

(57) ABSTRACT

Various embodiments herein relate to methods, apparatus and systems for forming a recessed feature in a dielectric-containing stack on a semiconductor substrate. In many embodiments, a mask shrink layer is deposited on a patterned mask layer to thereby narrow the openings in the mask layer. The mask shrink layer may be deposited through a vapor deposition process including, but not limited to, atomic layer deposition or chemical vapor deposition. The mask shrink layer can result in narrower, more vertically uniform etched features. In some embodiments, etching is completed in a single etch step. In some other embodiments, the etching may be done in stages, cycled with a deposition step designed to deposit a protective sidewall coating on the partially etched features. Metal-containing films are particularly suitable as mask shrink films and protective sidewall coatings.

19 Claims, 17 Drawing Sheets

(56) References Cited

U.S. PATENT DOCUMENTS

| | | | |
|---|---|---|---|
| 6,841,943 | B2 | 1/2005 | Vahedi et al. |
| 7,105,390 | B2 | 9/2006 | Brask et al. |
| 7,732,728 | B2 | 6/2010 | Dhindsa et al. |
| 7,740,736 | B2 | 6/2010 | Fischer et al. |
| 8,552,334 | B2 | 10/2013 | Tappan et al. |
| 9,378,971 | B1 | 6/2016 | Briggs et al. |
| 9,384,998 | B2 | 7/2016 | Hudson et al. |
| 2005/0136682 | A1* | 6/2005 | Hudson ............ H01L 21/31116 438/714 |
| 2006/0121721 | A1* | 6/2006 | Lee ................... H01L 21/76808 438/618 |
| 2007/0026677 | A1* | 2/2007 | Ji ...................... H01L 21/31144 438/689 |
| 2008/0286978 | A1* | 11/2008 | Chen ................. H01L 21/30655 438/713 |
| 2009/0163035 | A1* | 6/2009 | Romano ............ H01L 21/0337 438/736 |
| 2009/0275202 | A1 | 11/2009 | Tanaka et al. |
| 2010/0173494 | A1 | 7/2010 | Kobrin |
| 2013/0316518 | A1 | 11/2013 | Hollister et al. |
| 2014/0038412 | A1* | 2/2014 | Hu .................... H01L 21/76811 438/689 |
| 2015/0083582 | A1 | 3/2015 | Dhindsa et al. |
| 2016/0163556 | A1 | 6/2016 | Briggs et al. |
| 2016/0163557 | A1 | 6/2016 | Hudson et al. |
| 2016/0163558 | A1 | 6/2016 | Hudson et al. |
| 2016/0163561 | A1 | 6/2016 | Hudson et al. |
| 2016/0260617 | A1 | 9/2016 | Hudson et al. |
| 2016/0260620 | A1 | 9/2016 | Briggs et al. |
| 2016/0268141 | A1 | 9/2016 | Hudson |

OTHER PUBLICATIONS

Hudson et al., "Technique to Deposit Sidewall Passivation for High Aspect Ratio Cylinder Etch," U.S. Appl. No. 14/724,574, filed May 28, 2015.

Hudson et al., "Technique to Deposit Sidewall Passivation for High Aspect Ratio Cylinder Etch ," U.S. Appl. No. 14/697,521, filed Apr. 27, 2015.

Hausmann, Dennis Michael, "Method of Conditioning Vacuum Chamber of Semiconductor Substrate Processing Apparatus," U.S. Appl. No. 14/446,427, filed Jul. 30, 2014.

Yang et al. (2006) "CVD Growth Kinetics of $HfB_2$ Thin Films from the Single-Source Precursor $Hf(BH_4)_4$," *Chem. Mater.*, American Chemical Society, 18(21):5088-5096.

Yanguas-Gil et al. (Sep./Oct. 2009) "Highly conformal film growth by chemical vapor deposition. II. Conformality enhancement through growth inhibition," *Journal of Vacuum Science & Technology A*, 27(5):1244-1248.

Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.

Briggs et al., "Technique to Deposit Sidewall Passivation for High Aspect Ratio Cylinder Etch," U.S. Appl. No. 15/157,303, filed May 17, 2016.

Hudson et al., "Technique to Deposit Sidewall Passivation for High Aspect Ratio Cylinder Etch," U.S. Appl. No. 15/157,322, filed May 17, 2016.

Hudson et al., "Technique to Deposit Metal-Containing Sidewall Passivation for High Aspect Ratio Cylinder Etch," U.S. Appl. No. 14/803,578, filed Jul. 20, 2015.

Hudson, "Technique to Deposit Sidewall Passivation for High Aspect Ratio Cylinder Etch," U.S. Appl. No. 15/163,123, filed May 24, 2016.

US Office Action, dated Nov. 19, 2015, issued in U.S. Appl. No. 14/560,414.

US Notice of Allowance, dated Apr. 6, 2016, issued in U.S. Appl. No. 14/560,414.

US Office Action, dated Sep. 8, 2015, issued in U.S. Appl. No. 14/724,574.

US Final Office Action, dated Dec. 18, 2015, issued in U.S. Appl. No. 14/724,574.

US Notice of Allowance, dated Mar. 1, 2016, issued in U.S. Appl. No. 14/724,574.

Jung et al. (2005) "Vapor-Phase Self-Assembled Monolayer for Improved Mold Release in Nanoimprint Lithography," Langmuir, 21(4):1158-1161.

Zhuang et al. (2006) "Thermal stability of vapor phase deposited self-assembled monolayers for MEMS anti-stiction," J. Micromech. Microeng., 16:2259-2264.

Hudson, "Technique to Deposit Sidewall Passivation for High Aspect Ratio Cylinder Etch," U.S. Appl. No. 15/225,489, filed Aug. 1, 2016.

US Office Action, dated Jul. 11, 2016, issued in U.S. Appl. No. 14/697,521.

US Office Action, dated Jul. 26, 2016, issued in U.S. Appl. No. 14/803,578.

Hanson et al. (2003) "Bonding Self-Assembled, Compact Organophosphonate Monolayers to the Native Oxide Surface of Silicon," J. Am. Chem. Soc.,125(51):16074-16080.

Hudson et al., "Mask Shrink Layer for High Aspect Ratio Dielectric Etch," U.S. Appl. No. 15/359,362, filed Nov. 22, 2016.

US Notice of Allowance, dated Nov. 14, 2016, issued in U.S. Appl. No. 14/697,521.

* cited by examiner

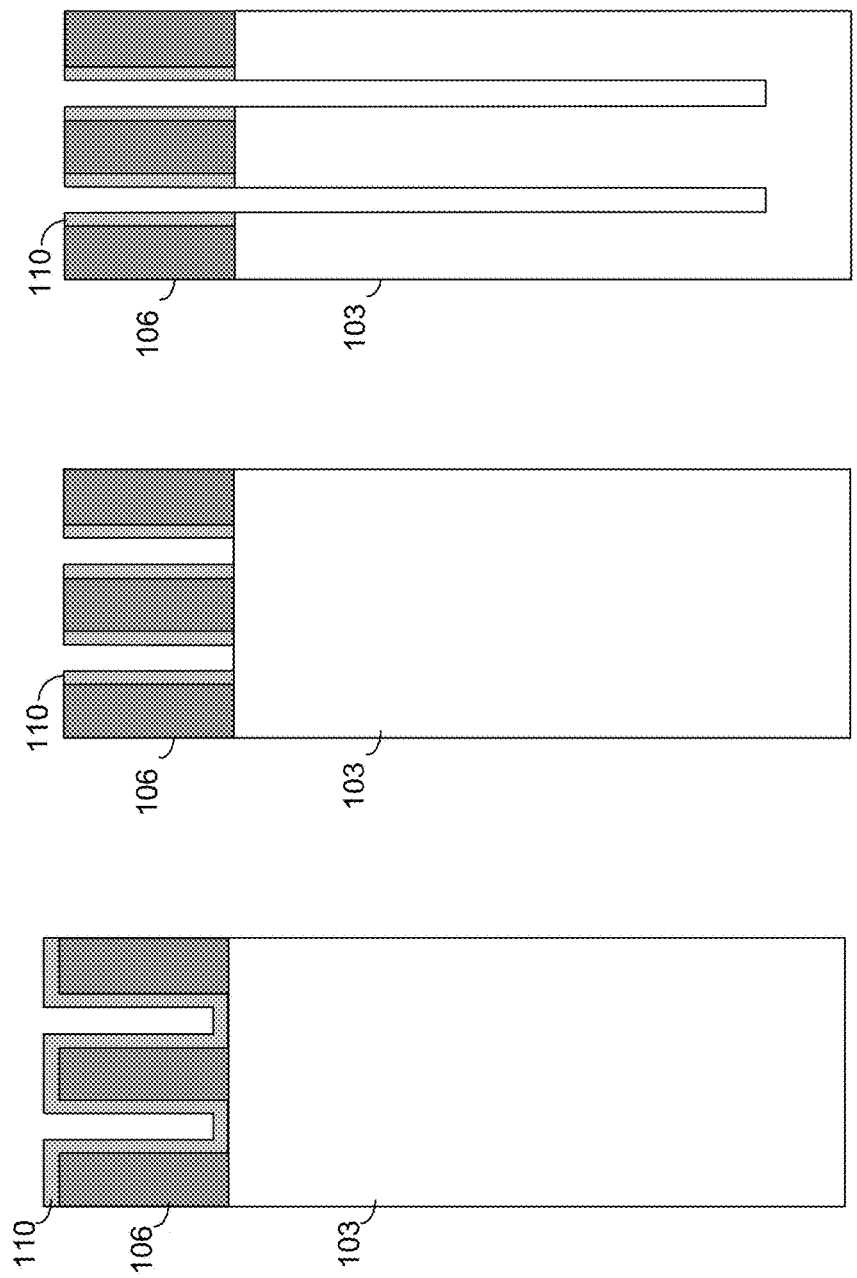

MASK SHRINK LAYER FOR HIGH ASPECT RATIO DIELECTRIC ETCH

BACKGROUND

One process frequently employed during fabrication of semiconductor devices is formation of an etched cylinder in dielectric material. Example contexts where such a process may occur include, but are not limited to, memory applications such as DRAM and 3D NAND structures. As the semiconductor industry advances and device dimensions become smaller, such cylinders become increasingly harder to etch in a uniform manner, especially for high aspect ratio cylinders having narrow widths and/or deep depths.

SUMMARY

Certain embodiments herein relate to methods and apparatus for forming an etched feature in a dielectric-containing stack on a semiconductor substrate.

In one aspect of the disclosed embodiments, a method of forming an etched feature in a dielectric-containing stack on a semiconductor substrate is provided, the method including: (a) receiving a substrate including the dielectric-containing stack and a mask layer positioned over the dielectric-containing stack, the mask layer including a pattern including openings in the mask layer; (b) depositing a mask shrink layer on the mask layer, where the mask shrink layer is formed through a vapor deposition process and includes a metal-containing material, and where the mask shrink layer lines the openings in the mask layer; (c) generating an etching plasma including an etching reactant, exposing the substrate to the etching plasma, and etching the feature in the dielectric-containing stack, where the feature has an aspect ratio of about 5 or greater at its final depth.

In some embodiments, the mask shrink layer includes a metal nitride, a metal oxide, a metal carbide, a metal boride, or a combination thereof. The metal in the mask shrink layer may be selected from the group consisting of titanium, tantalum, ruthenium, aluminum, iron, hafnium, and combinations thereof. Any of these metals may be provided as a nitride, oxide, carbide, boride, or some combination thereof. In various cases the mask shrink layer includes a metal nitride.

The etching process may occur in phases. In some embodiments (c) includes at least a first phase and a second phase, where the first phase is performed under conditions that result in etching through the mask shrink layer at the bottom of the openings in mask layer, and the second phase is performed under conditions that result in etching through the dielectric-containing stack.

The mask shrink layer may be deposited through an atomic layer deposition reaction in some embodiments. For instance, (b) may include (i) exposing the substrate to a first deposition reactant and allowing the first deposition reactant to adsorb onto sidewalls of the openings in mask layer; and (ii) after (i), exposing the substrate to a second deposition reactant and reacting the first and second deposition reactants in a surface reaction, thereby forming the mask shrink layer on the sidewalls of the openings in the mask layer. In some such cases, (b) does not involve plasma. In some other cases, (ii) further includes exposing the substrate to a mask shrink layer deposition plasma including the second deposition reactant, where exposing the substrate to the mask shrink layer deposition plasma drives a surface reaction between the first deposition reactant and the second deposition reactant, thereby forming the mask shrink layer on the sidewalls of the openings in the mask layer. In some other embodiments, (b) includes depositing the mask shrink layer through a chemical vapor deposition reaction including exposing the substrate to a first deposition reactant and a second deposition reactant simultaneously. In certain implementations, the mask shrink layer may be deposited to include at least a first sub-layer and a second sub-layer, the first and second sub-layers being deposited under different conditions. The first and second sub-layers may have different compositions in certain embodiments.

The method may be applied to a number of different feature shapes. In some cases, the feature etched into the dielectric-containing stack is a cylinder, trench, or line. In a number of cases the feature is a high aspect ratio cylinder, for example having an aspect ratio of at least about 5, 10, 20, 30, 40, 50, 60, 80, or 100. In certain implementations, after the feature is etched to its final depth, the feature has an aspect ratio of about 20 or greater, and a bow of about 20% or less.

The method may be practiced in a variety of contexts. In some embodiments, the feature is formed in the context of forming a 3D NAND device, and the dielectric-containing stack includes alternating layers of (i) an oxide material, and (ii) a nitride material or polysilicon material. In some other embodiments, the feature is formed in the context of forming a DRAM device, and where the dielectric-containing stack includes layers of silicon oxide and one or more layers of silicon nitride.

In certain implementations, the etching process may be carried out in a piecewise fashion. For instance, an etching reaction may be cycled with a deposition reaction, where the deposition reaction results in formation of a protective sidewall coating on the partially etched features. In some embodiments, (c) includes: (i) partially etching the feature, (ii) after (i), depositing a protective film on sidewalls of the feature, where the protective film is deposited along substantially the entire depth of the feature, and (iii) repeating (i) and (ii) until the feature is etched to a final depth, where the protective film deposited in (ii) substantially prevents lateral etch of the feature in subsequent iterations of (i). In some such cases, the protective film may be deposited through a thermally driven atomic layer deposition reaction, and the protective film may include a metal-containing film.

In another aspect of the disclosed embodiments, an apparatus for forming an etched feature in a dielectric-containing stack on a semiconductor substrate is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, and an outlet for removing material from the reaction chamber, and a controller having instructions for: (a) flowing one or more vapor phase deposition reactants into the reaction chamber designed or configured to perform deposition and depositing a mask shrink layer on a substrate, the substrate including the dielectric-containing stack and a mask layer positioned over the dielectric-containing stack, the mask layer including a pattern including openings in the mask layer that define where the features are to be etched, where the mask shrink layer lines the openings in the mask layer to thereby narrow the openings in the mask layer, and where the mask shrink layer includes a metal-containing material; and (b) generating an etching plasma including an etching reactant, exposing the substrate to the etching plasma, and etching the feature in the dielectric-containing stack, where (b) is performed in the reaction chamber designed or configured to perform etching, where the feature has an aspect ratio of about 5 or greater at its final depth.

In some implementations, the reaction chamber designed or configured to perform etching is the same reaction chamber designed or configured to perform deposition, such that both (a) and (b) occur in the same reaction chamber. In some other cases, the reaction chamber designed or configured to perform etching is different from the reaction chamber designed or configured to perform deposition, and where the controller further includes instructions to transfer the substrate under vacuum conditions between the reaction chamber designed or configured to perform etching and the reaction chamber designed or configured to perform deposition.

In some embodiments, the controller may have instructions to perform (a) by depositing the mask shrink layer using a thermally driven atomic layer deposition reaction. The etching process may occur in a piecemeal fashion in some cases, with a deposition reaction used intermittently between etching reactions. For example, the controller may have instructions to perform (b) by: (i) partially etching the substrate, (ii) after (i), depositing a protective film on sidewalls of the partially etched feature, where the protective film is deposited along substantially the entire depth of the partially etched feature, and (iii) repeating (i) and (ii) until the feature is etched to a final depth, where the protective film deposited in (ii) substantially prevents lateral etch of the feature during subsequent iterations of (i).

These and other features will be described below with reference to the associated drawings.

BRIEF DESCRIPTION OF THE DRAWINGS

FIGS. 1B-1D illustrate a partially fabricated semiconductor device at different points in time during manufacture, including after deposition of a mask shrink layer (FIG. 1B), after punching through the mask shrink layer (FIG. 1C), and after etching features into the dielectric-containing material (FIG. 1D).

DETAILED DESCRIPTION

Figure 1A:
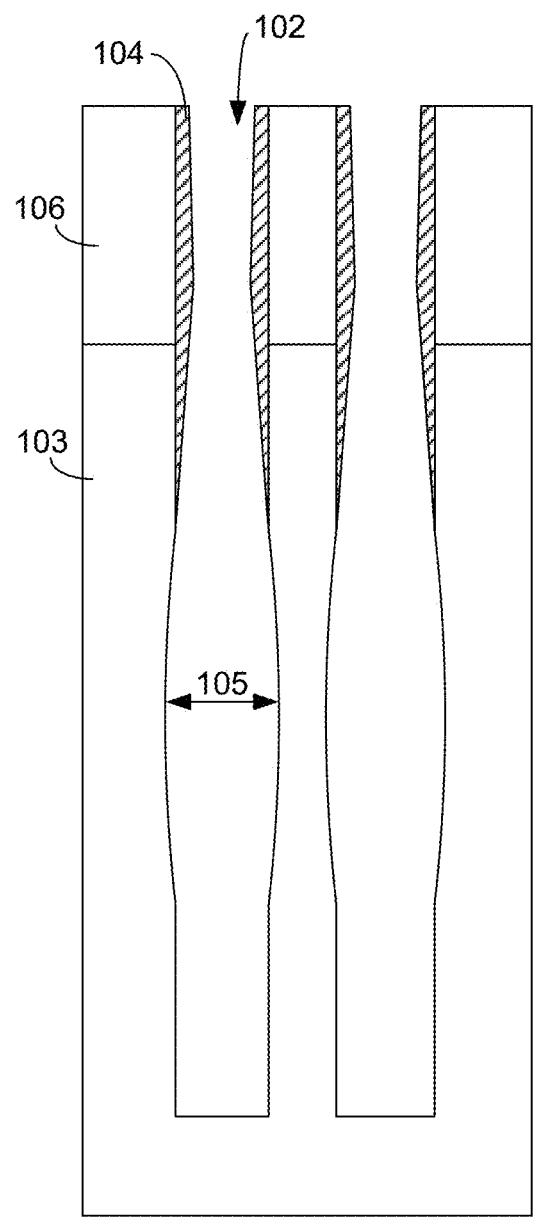
FIG. 1A illustrates an etched cylinder having an undesirable bow due to excessive CD etching on the sidewalls.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

A number of process variables have been described herein. In a number of cases, these process variables are relevant for processing substrates that are 300 mm in diameter. In some embodiments, the reported process variables may be scaled for processing substrates of other sizes. For example, RF power values for generating or maintaining plasma may scale linearly based on substrate area. Similarly, reactant flow rates may scale based on substrate area, and in some cases based on the size of an available reactor.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Technology for Etching High Aspect Ratio Features

Fabrication of certain semiconductor devices involves etching features into a dielectric material or materials. The dielectric material may be a single layer of material or it may be integrated into a stack of materials. In some cases a stack includes alternating layers of different materials (e.g., silicon nitride and silicon oxide, or silicon oxide and polycrystalline silicon). One example etched feature is a cylinder, though other shapes may also be used. In many cases, the feature may have a high aspect ratio. As the aspect ratio of such features continues to increase, it is increasingly challenging to etch the features into dielectric-containing stacks.

The dielectric-containing stack to be etched is typically provided with a patterned mask layer thereon. Often, the mask layer may be made of materials such as silicon (e.g., polycrystalline silicon or amorphous silicon) or carbon (e.g., amorphous carbon). Polycrystalline silicon masks are commonly used in the context of forming a DRAM device, while carbon masks are commonly used in the context of forming a 3D NAND device. Other mask materials may also be used. The mask layer is typically consumed to some degree as the cylinders or other structures are etched into the dielectric-containing stack. As a result, the mask layer may be deposited as a relatively thick layer (e.g., between about 500-1500 nm in some cases).

In order to pattern the relatively thick mask layer, a series of lithography/pattern transfer processes are used. These processes may involve successively transferring a defined pattern through a series of layers, finally resulting in a patterned mask layer over the dielectric-containing stack. The lithography/pattern transfer processes are relatively complex, and frequently result in a mask layer having openings that are larger than desired for a particular application. One result of the larger than desired openings is that the cylinders etched into the dielectric-containing stack can be undesirably wide. In other words, patterned mask layers having undesirably large critical dimensions in the pattern openings result in etched features having undesirably large critical dimensions throughout the etched features.

Another problem that can arise during etching of high aspect ratio features is a non-uniform etching profile. In other words, the features do not etch in a straight downward direction. Instead, the sidewalls of the features are often bowed such that a middle portion of the etched feature is wider (i.e., further etched) than a top and/or bottom portion of the feature. The portion of the feature that bows outwards may occupy a relatively small portion of the total feature depth, or a relatively larger portion. The portion of the feature that bows outward is where the critical dimension (CD) of the feature is at its maximum. The critical dimension corresponds to the diameter of the feature at a given spot. It is generally desirable for the maximum CD of the feature to be about the same as the CD elsewhere in the feature, for example at or near the bottom of the feature.

Excessive CD etching can result in compromised structural and/or electronic integrity of the remaining material. These problems can arise from excessive CD etching at only a portion of the feature (bowing) and/or from excessive CD etching over the entire feature (e.g., where the mask openings are undesirably large). For example, current leakage and/or parasitic coupling between adjacent cells (which are later formed in the etched features) can become problematic if the remaining dielectric material between adjacent etched features is too thin (e.g., as a result of excessive CD etching).

Without being bound by any theory or mechanism of action, it is believed that the excessive CD etching at the middle portion of the cylinder or other feature occurs at least partially because the sidewalls of the cylinder are insufficiently protected from etching. Conventional etch chemistry utilizes fluorocarbon etchants to form the cylinders in the dielectric material. The fluorocarbon etchants are excited by plasma exposure, which results in the formation of various fluorocarbon fragments including, for example, $CF$, $CF_2$, and $CF_3$. Reactive fluorocarbon fragments etch away the dielectric material at the bottom of a feature (e.g., cylinder) with the assistance of ions. Other fluorocarbon fragments are deposited on the sidewalls of the cylinder being etched, thereby forming a protective polymeric sidewall coating. This protective sidewall coating promotes preferential etching at the bottom of the feature as opposed to the sidewalls of the feature. Without this sidewall protection, the feature begins to assume a non-uniform profile, with a wider etch/cylinder width where the sidewall protection is inadequate.

Sidewall protection is especially difficult to achieve in high aspect ratio features. One reason for this difficulty is that existing fluorocarbon-based processes cannot form the protective polymeric sidewall coating deep in the cylinder being etched. FIG. 1A presents a figure of a cylinder 102 being etched in a dielectric-containing material 103 coated with a patterned mask layer 106. While the following discussion sometimes refers to cylinders, the concepts apply to other feature shapes such as rectangles and other polygons. A protective polymeric sidewall coating 104 is concentrated near the top portion of the cylinder 102. $C_xF_y$ chemistry provides both the etch reactant(s) for etching the cylinder vertically, as well as the reactant(s) that form the protective polymeric sidewall coating 104. Because the protective polymeric sidewall coating 104 does not extend deep into the cylinder (i.e., there is insufficient deposition on the sidewall), the middle portion of the cylinder 102 becomes wider than the top portion of the cylinder 102. The wider middle portion of the cylinder 102 is referred to as the bow 105. The bow can be numerically described in terms of a comparison between the critical dimension of the feature at the bow region and the critical dimension of the feature below the bow region. The bow may be numerically reported in terms of distance (e.g., the critical dimension at the widest part of the feature minus the critical dimension at the narrowest part of the feature below the bow) or in terms of a ratio/percent (the critical dimension at the widest part of the feature divided by the critical dimension at the narrowest part of the feature below the bow). This bow 105, and the related non-uniform etch profile, is undesirable. Because of the high ion energies often used in this type of etching process, bows are often created when etching cylinders of high aspect ratios. In some applications, bows are created even at aspect ratios as low as about 5. As such, conventional fluorocarbon etch chemistry is typically limited to forming relatively low aspect ratio cylinders in dielectric materials. Some modern applications require cylinders having higher aspect ratios than those that can be achieved with conventional etch chemistry.

In various embodiments, a deposition step may take place after the mask layer is patterned and before the dielectric-containing structure is etched. This deposition step may be used to deposit a mask shrink layer on the patterned mask layer to thereby decrease the size of the openings in the mask layer. The mask shrink layer therefore achieves narrower etched features, without the need to change any of the complex processes involved in transferring the desired pattern to the mask layer.

In certain embodiments, special steps may be taken to protect the sidewalls from excessive CD etching. Such steps may relate to deposition of a protective sidewall coating after the features have been partially etched into the dielectric-containing stack. This technique may be combined with the mask shrink technique mentioned above. In some cases the protective sidewall coating deposition may be cycled with the etching operation such that the protective sidewall coating is periodically deposited as the feature is further etched into the dielectric-containing stack. In some other embodiments, no deposition steps are taken to form a protective coating on the sidewalls. In these embodiments, a polymeric sidewall coating 104 may form during the etch process as a result of the etching chemistry as described above.

II. Context and Applications

In various embodiments herein, features are etched in a substrate (typically a semiconductor wafer) having dielectric material and a patterned mask layer thereon. In certain embodiments, the dielectric material is provided in a stack of alternating materials, some or all of which may be dielectric materials. The etching processes are generally plasma-based etching processes. The overall feature formation process may occur in stages: one stage directed at forming a mask shrink layer to narrow the openings in the mask layer, a second stage directed at punching through the mask shrink layer at relevant locations, and a third stage directed at etching the features into the dielectric material. The second and third stages may be separate or combined. In some implementations, the second and third stages may occur together in a single etching process, though different reaction conditions may be used for each stage. In some other implementations, the second and third stages are performed in separate etching processes. In still other implementations, the second and third stages may be performed in a single etching process, without any change in the conditions between the second and third stages.

An optional fourth stage may be directed at forming a protective sidewall coating without substantially etching the dielectric material. The optional protective sidewall coating may be used to passivate the sidewalls and prevent the feature from being etched to an undesirably large CD (i.e., the sidewall coating prevents lateral etch of the feature). In embodiments where the fourth stage is used, it may be cycled together with the third stage after the first stage and the optional second stage are performed. Typically, the first stage and second stages are performed only once.

As used herein, the term mask shrink layer refers to a layer of material that is deposited on a patterned mask layer to thereby narrow the openings defined in the mask layer. The mask shrink layer is typically deposited after the mask layer is patterned, and before the dielectric-containing stack is substantially etched. For instance, in a number of embodiments, the mask shrink layer may be deposited before the dielectric-containing stack is etched at all. In some other embodiments, the dielectric-containing stack may be etched to a small degree (e.g., no more than about 400 nm deep) before deposition of the mask shrink layer, such etching occurring largely as a result of etching/patterning the mask layer. In certain embodiments, the majority of the mask shrink layer is deposited directly on the patterned mask layer. However, the mask shrink layer may be deposited conformally, and some portion of the mask shrink layer may form at the bottom of the features patterned in the mask layer, which may be on/near the top of the dielectric-containing stack. By contrast, a protective sidewall coating (where used) is typically deposited after the features are partially etched into the dielectric-containing stack. Therefore, the protective sidewall coating deposits on the sidewalls of both the patterned mask layer and the partially etched features in the dielectric-containing stack.

In a number of embodiments herein, the mask shrink layer and/or the optional protective sidewall coating are metal-containing films. Metal-containing films have been shown to provide improved etch resistance/sidewall protection compared to other types of film such as silicon oxide, boron nitride, and hydrocarbon polymers. Experimental results illustrating the improved etch results are shown in the Experimental section below.

Metal-containing films can be advantageous as mask shrink layers and/or protective sidewall coatings because some such films have a higher electrical conductivity, as compared to dielectric films. Without being limited to the following explanations, it is believed that higher electrical conductivity reduces the risk of experiencing unwanted electrical charging effects within the partially etched feature during the etch process. During an etch process, a potential difference can develop between the top and bottom of a partially etched feature. This potential difference may act to repel ions such that a percentage of the ions do not travel as desired to the bottom of a feature. For example, ions that would otherwise travel to the bottom of a feature may be repelled either (a) away from the feature, such that the ion does not etch the feature, or (b) into a sidewall of the feature, such that the sidewall becomes etched to an undesirably large CD, leading to an undesirable bow in the feature and a reduced vertical etch rate. By contrast, where a more conductive metal-containing film lines the feature (or a portion thereof), the more conductive film may enable charges within the feature to dissipate such that there is no potential difference (or only a minimal potential difference) between different portions of the recessed feature during etching. This reduces the likelihood that ions will be undesirably repelled, leading to an improved profile and increased vertical etch rate.

Another reason that metal-containing films might be beneficial in various implementations is that they can provide a different sidewall surface, as compared to other types of sidewall protection films, during the etching operation. This may lead to different surface chemical reactivity and catalysis on the sidewall surfaces during etching. One result may be that the set of species that reaches the bottom of the feature is different than the set of species that would reach the bottom of the feature using other types of protective sidewall films and/or mask shrink films (or using no such films). For example, a metal-containing film may result in a different speciation of neutral atoms and molecules reaching the bottom of the feature, which may have positive impacts in terms of etch rate, etch profile, striations, and distortion.

Further, metal-containing films may be deposited with a high degree of conformality in many cases. Various metal-containing films can be deposited with higher conformality than silicon oxide and many other silicon-containing and boron-containing films. This improved conformality is advantageous at least because it decreases the likelihood that the top of the feature will become blocked during the deposition stages. As used herein, conformality may be calculated as $T_1/T_2$, where $T_1$ is the thickness of the film (e.g., the protective sidewall coating) at the thinnest portion of the film and $T_2$ is the thickness of the film at the thickest portion of the film (both thicknesses being measured along the sidewall). For example, a film deposited along the entire length of a sidewall and having a thickness that ranges between about 5-8 nm has a conformality of about 0.625 or 62.5%. In various embodiments herein, a metal-containing film used as a mask shrink layer and/or as a protective sidewall coating may be deposited at a conformality that is at least about 0.3.

As noted above, the etching process may occur in various stages. The first stage may relate to forming a mask shrink layer to narrow openings in the mask layer. The second stage may relate to punching through the mask shrink layer at the bottom of the patterned features. A third stage may relate to etching the dielectric-containing stack. A fourth stage, which is optional, may relate to depositing a protective sidewall coating on the sidewalls of partially etched features in the dielectric-containing stack.

In a number of embodiments, the mask shrink layer is deposited only a single time. Similarly, the mask shrink layer is only punched through a single time. By contrast, the etching operation for etching the dielectric-containing stack may occur any number of times. In some cases, the entire cylinder may be etched in a single process. In some other embodiments, the third and fourth stages are cycled such that after the cylinders are partially etched, a protective sidewall coating is deposited. The etching and protective sidewall coating deposition processes can be cycled as the cylinders are etched to their final depth, thereby forming features having more uniform diameters/improved profiles.

A feature is a recess in the surface of a substrate. Features can have many different shapes including, but not limited to, cylinders, rectangles, squares, other polygonal recesses, trenches, etc.

Aspect ratios are a comparison of the depth of a feature to the critical dimension of the feature (often its width/diameter). For example, a cylinder having a depth of 2 µm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

The material into which the feature is etched may be a dielectric material in various cases. Example materials include, but are not limited to, silicon oxides, silicon nitrides, silicon carbides, oxynitrides, oxycarbides, carbonitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. The material or materials that are etched may also include additional elements, including but not limited to hydrogen. In some embodiments, a nitride and/or an oxide material being etched will have a composition that includes hydrogen. As used herein, it is understood that silicon oxide materials, silicon nitride materials, etc. include both stoichiometric and non-stoichiometric versions of such materials, and that such materials may have other elements included, as described above.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1200 nm thick and one or more of the silicon nitride layers being between about 300-400 nm thick. The etched feature may be a cylinder having a final depth between about 1-3 µm, for example between about 1.5-2 µm. The cylinder may have a width between about 20-50 nm, for example between about 25-30 nm. After the cylinder is etched, a capacitor memory cell can be formed therein. In some implementations, DRAM features are particularly narrow, and it has been difficult to adequately pattern the overlying mask layer with sufficiently small openings. Often, after the pattern is defined and transferred through the various pattern transfer layers, as needed, the openings on the resulting patterned mask layer are undesirably large. As such, the mask shrink techniques described herein are particularly useful in the context of forming DRAM devices. However, these techniques may also be used in other contexts, as well.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. The oxide layers may have a thickness between about 20-50 nm, for example between about 30-40 nm. The nitride or polysilicon layers may have a thickness between about 20-50 nm, for example between about 30-40 nm. The feature etched into the alternating layer may have a depth between about 2-6 µm, for example between about 3-5 µm. The feature may have a width between about 50-150 nm, for example between about 50-100 nm.

III. Deposition of Mask Shrink Layer

After the mask layer above the dielectric-containing stack is patterned, a mask shrink layer may be deposited to alter the shape of the pattern defined by the mask layer. Typically, this shape change relates to a narrowing of the openings in the pattern. In certain applications, it is difficult to pattern the mask layer with sufficient accuracy. In some cases, the mask layer is fairly thick, and a complicated series of steps is undertaken to define and transfer the pattern into the thick mask layer. By the time the pattern is transferred into the mask layer, the openings in the pattern may be too large. To address this issue, a mask shrink layer may be provided to narrow the openings in the mask layer.

The mask shrink layer is deposited conformally. In some cases, the conformality of the mask shrink layer is at least about 0.3. In certain cases, the mask shrink layer may be deposited to a thickness between about 1-10 nm, for example between about 2-5 nm. In one example, the mask layer defines openings having a CD of about 35 nm, and a mask shrink layer having a thickness of about 3 nm is deposited on the patterned mask layer. Because the mask shrink layer deposits conformally on all surfaces of the patterned mask layer, the critical dimension of the opening in the patterned mask layer shrinks by twice the film thickness (since the film is deposited on opposite sidewalls that define the CD). After deposition of the mask shrink layer, the openings in the pattern have a CD of about 29 nm (35 nm−2*3 nm=29 nm). In various implementations, the openings have a CD of about 10-100 nm, or about 20-80 nm, or about 25 to 50 nm.

A number of different deposition techniques may be used to deposit the mask shrink layer. In some implementations, a thermal or plasma-based atomic layer deposition (ALD) reaction may be used to deposit the mask shrink layer. In some other implementations, a thermal or plasma-based chemical vapor deposition (CVD) reaction may be used to deposit the mask shrink layer. While adsorption-based methods such as ALD are known to form very conformal films, some CVD techniques are also capable of forming conformal films. Such techniques are described further below. Other deposition techniques that result in formation of conformal films may also be used.

The mask shrink layer results in the formation of etched features that are narrower than would be achieved without deposition of the mask shrink layer. Experimental results, described further below, show that the smaller CD of the mask openings (after deposition of the mask shrink layer) results in formation of etched features having smaller critical dimensions throughout the features. Unexpectedly, the experimental results also show that the mask shrink layer resulted in formation of etched features that had a lower degree of bow and a more uniform vertical profile. Therefore, it is believed that the mask shrink layer promotes formation of high quality devices by ensuring that (1) features are not overly wide overall, and (2) features are not overly wide at any particular portion of the feature. This reduction in bowing as a result of the mask shrink layer was unexpected.

In a number of embodiments, the mask shrink layer may be a metal-containing film. In certain embodiments, the metal in the metal-containing film is selected from the group consisting of tungsten, titanium, aluminum, tantalum, ruthenium, iron, and hafnium. The metal-containing film may be provided in the form of an oxide, boride, nitride, etc. Both stoichiometric and non-stoichiometric formulations are contemplated. Additional details related to the mask shrink film, and formation thereof, are provided below.

FIG. 1B presents a drawing illustrating a dielectric-containing material 103 having an overlying patterned mask layer 106 after a mask shrink layer 110 is deposited. In this example, the mask shrink layer 110 was deposited after the pattern was formed in the patterned mask layer 106, and before the features begin to be etched in the dielectric-containing material 103.

IV. Punching Through the Mask Shrink Layer

As seen in FIG. 1B, the mask shrink layer 110 deposits conformally, including at the bottom of the patterned features. In FIG. 1B, the feature bottom is at the interface of the dielectric-containing material 103 and the patterned mask layer 106. In certain implementations, the bottom of the feature may be slightly above or below this interface, depending on the extent of etching that occurs when transferring the pattern to the patterned mask layer 106. In order to etch the features into the dielectric-containing material 103, the mask shrink layer 110 should be removed at the bottom of the patterned features.

In some embodiments, removal of the mask shrink layer may be accomplished during the process used to etch the features into the dielectric-containing material. In some such cases, there may be no need for any extra steps or process changes, and the mask shrink layer may be adequately removed under the conditions used to etch the features in to the dielectric-containing material. In this sense, removal of the mask shrink layer at the bottom of the patterned features may be considered optional in some cases (since it happens as an inherent result of another step). In some other cases, the etching process may be done in phases, with a first phase conducted under a first set of processing conditions designed to punch through the mask shrink layer at the relevant locations, and a second phase conducted under a second set of processing conditions designed to etch the dielectric-containing materials. The first and second phases may be part of a single etching process, or they may be performed in separate etching processes. The different etching processes may occur in the same reaction chamber or in different reaction chambers.

The process used to punch through the mask shrink layer is further described below. Generally speaking, but depending on the material used in the mask, the process involves the same chemistry used to etch the features into the dielectric-containing material. A fairly high bias and low degree of polymerization may be used, as discussed further below.

FIG. 1C presents a drawing showing the partially fabricated device of FIG. 1B, after the mask shrink layer 110 is removed at the bottom of the patterned features. The process used to punch through/remove the mask shrink layer 110 is further discussed below.

V. Process Flow for Deposition and Etching Processes

Figure 1E:
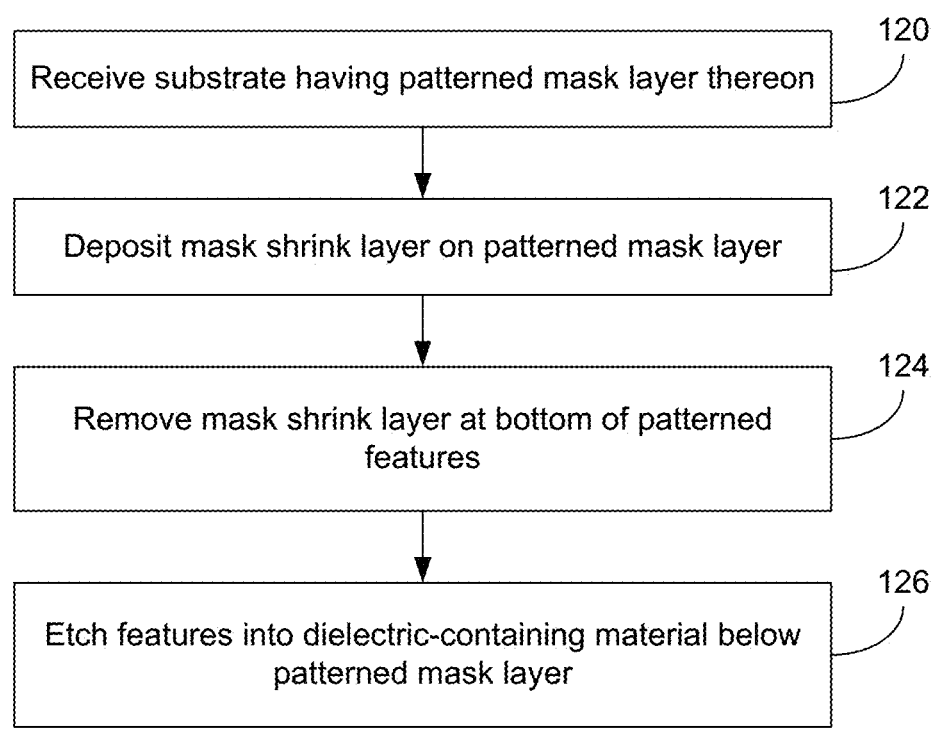
FIG. 1E presents a flowchart for a method of etching high aspect ratio features in a dielectric-containing material according to certain embodiments.

FIG. 1D shows the partially fabricated device of FIGS. 1B and 1C after completing an etch process to etch the features into the dielectric-containing material 103, according to one embodiment. FIG. 1E presents a flowchart for a method of forming an etched feature in a semiconductor substrate. The method in FIG. 1E is described in relation to FIGS. 1B-1D.

The method begins at operation 120, where a substrate having a patterned mask layer 106 is received. The patterned mask layer 106 typically overlies a dielectric-containing material 103. The patterned mask layer 106 includes openings therein, which define where the features are to be etched into the dielectric-containing material 103. In various implementations, the openings in the patterned mask layer 106 are undesirably large. The overly large openings may arise as a result of limitations or other considerations during the lithography/pattern transfer processes. For instance, the process used to initially define the pattern may be unable to create a pattern with sufficiently small dimensions. In these or other cases, the process(es) used to transfer/etch the pattern through the various pattern transfer layers may undesirably widen the openings as the pattern is transferred through the relevant layers. In various embodiments, multiple patterning techniques are used to define the pattern in the mask layer. Multiple patterning refers to a class of technologies used for enhancing feature density. The resolution of a photoresist pattern begins to become blurry on the order of about 40-50 nm half-pitch. Multiple patterning techniques can be used to overcome this barrier and define even smaller features. Generally speaking, multiple patterning techniques include, but are not limited to, self-aligned double patterning (SADP), sidewall image transfer (SIT), double/multiple exposure, double expose/double etch, directed self-assembly (DSA), etc. In addition to the process(es) used to initially define the pattern, additional processes may be used to transfer the pattern through various pattern transfer layers in order to form the pattern in the mask layer that is positioned directly over the dielectric-containing stack. Several pattern transfer layers may be needed, for example due to the thickness of the mask layer and the fact that the pattern transfer layers may be consumed as the pattern is transferred down through the relevant layers.

As noted elsewhere herein, the dielectric-containing material 103 may be a stack of alternating materials, at least one of which is a dielectric material. Alternatively, the dielectric-containing material is a homogeneous or quasi-homogeneous material such as silicon oxide or silicon nitride. Next, at operation 122, a mask shrink layer 110 is deposited on the patterned mask layer 106. The mask shrink layer 110 deposits on all surfaces of the patterned mask layer 106, including along the sidewalls, as shown in FIG. 1B. Next, the mask shrink layer 110 is removed at the bottom of the patterned features in operation 124. At operation 126, the features are etched into the dielectric-containing material 103. Operations 122, 124, and 126 may each occur in a separate reaction chamber, or in a shared reaction chamber. In many cases, operations 124 and 126 occur in the same reaction chamber, and may be completed in a single etching process (which may or may not have different phases using different conditions for achieving operations 124 and 126). The deposition in operation 122 may occur in the same chamber as the etching operations, though in some cases a separate reaction chamber is provided for this purpose. Where more than one reaction chamber is provided to perform operations 122, 124, and 126, such reaction chambers may be provided together on an integrated tool. The integrated tool may include a vacuum transfer chamber or other configuration that allows for the substrate to be transferred under vacuum between subsequent operations. Further details related to each operation are provided below.

The method shown in FIG. 1E presents one basic embodiment. In some other embodiments, a more complicated set of operations may be used. For example, the etching process (operation 126 of FIG. 1E) may be stopped before the feature is fully etched, and a deposition operation may be performed to deposit a protective sidewall coating on sidewalls of the partially etched feature. This etching (in the dielectric-containing material) and protective sidewall deposition may be cycled until the feature reaches its final depth.

Figure 2A:
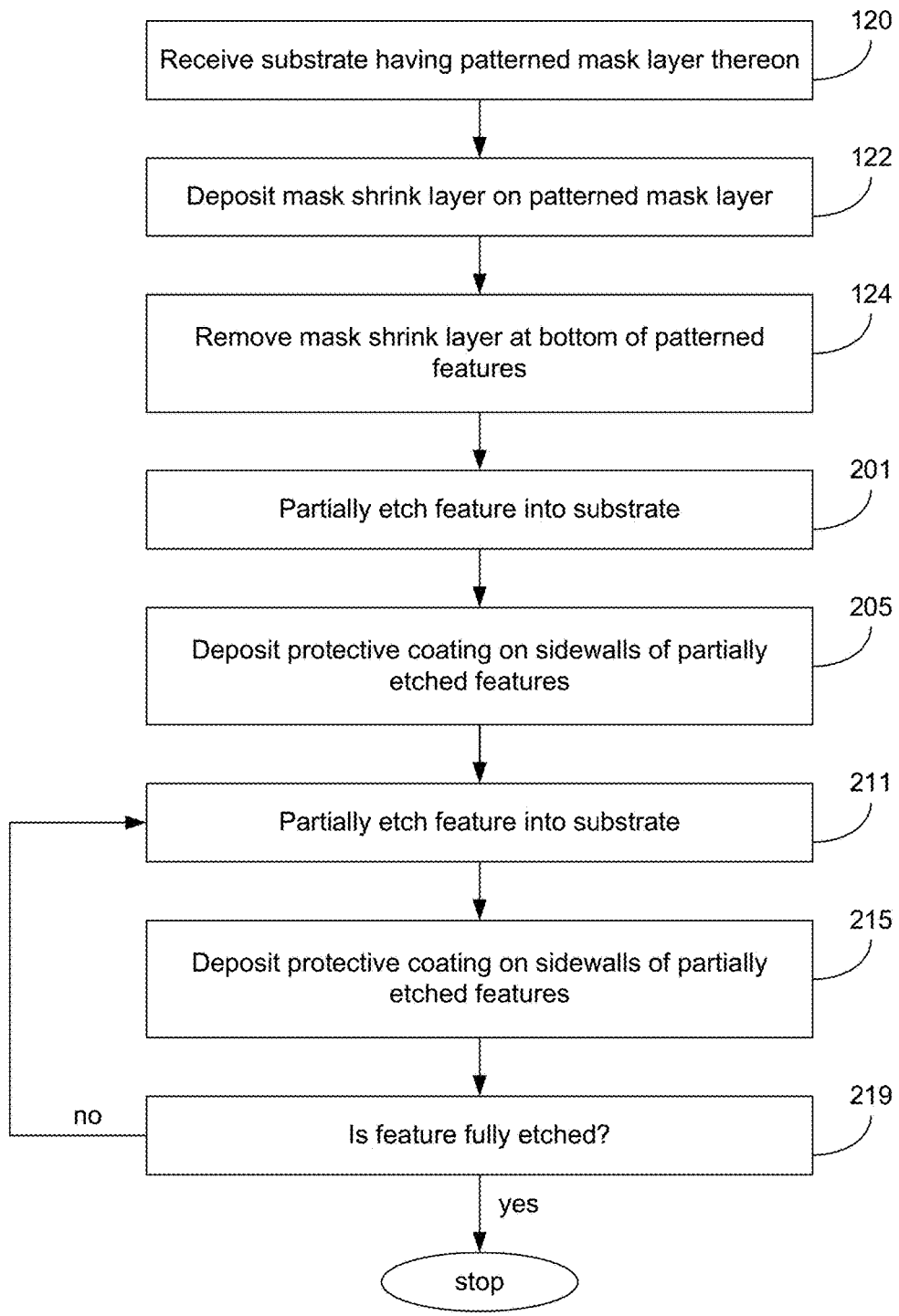
FIG. 2A presents a flowchart for a method of forming an etched feature on a semiconductor substrate according to various disclosed embodiments.

FIG. 2A presents a flowchart for a method of forming an etched feature in a semiconductor substrate. In this embodiment, the feature is etched into the dielectric material in a cyclic manner, with a periodic deposition operation to deposit a protective sidewall coating on the sidewalls of the partially etched feature. The operations shown in FIG. 2A are described in relation to FIGS. 3A-3D, which show a partially fabricated semiconductor substrate as the feature is etched. The operations are also described in relation to FIG. 2B, which presents one option for a method of depositing a protective sidewall coating and/or mask shrink layer. The method begins with operations 120, 122, and 124, which have been described in relation to FIG. 1E. In the context of FIGS. 3A-3D, the dielectric-containing material is shown as reference numeral 303, the patterned mask is shown as reference numeral 306, and the mask shrink layer is shown as reference numeral 320.

Next, at operation 201, a feature 302 is etched to a first depth in the dielectric-containing material 303. This first depth is only a fraction of the final desired depth of the feature. The chemistry used to etch the feature may be a fluorocarbon-based chemistry ($C_xF_y$). Other etch chemistries may be used. This etching operation 201 may result in formation of a first sidewall coating 304. The first sidewall coating 304 may be a polymeric sidewall coating, as described with relation to FIG. 1A. The first sidewall coating 304 extends toward the first depth, though in many cases the first sidewall coating 304 does not actually reach the bottom of the feature 302.

The first sidewall coating 304 indirectly forms from the $C_xF_y$ etching chemistry as certain fluorocarbon species/fragments deposit on the sidewalls of the feature (i.e., certain fluorocarbon species are precursors for the first sidewall coating 304). The first sidewall coating 304 typically provides only partial protection against excessive CD etching of the sidewalls of the feature 302, since it only reaches part way down the feature. In some implementations, the etch conditions provide little, if any, sidewall protection.

After the etching is stopped, a second sidewall coating 310 is deposited in operation 205. In some cases, coating 310 may be effectively the first sidewall coating. This deposition may occur through various reaction mechanisms including, but not limited to, chemical vapor deposition (CVD) methods and atomic layer deposition (ALD) methods (either of which may or may not be plasma-assisted). ALD methods are particularly well suited for forming conformal films that line the sidewalls of the features. For instance, ALD methods are useful for delivering reactants deep into features due to the adsorption-driven nature of such methods. While the embodiments herein are not limited to methods in which the second sidewall coating 310 is deposited through ALD, the method chosen to deposit the second sidewall coating 310 should allow for the protective layer to be formed deep in the etched feature 302. CVD and other deposition processes may be suitable in various implementations, particularly where the deposition can be carried out in a conformal manner.

As mentioned above, in a number of implementations the second sidewall coating 310 may be a metal-containing film. Metal-containing films have been shown to provide improved etch resistance/sidewall protection compared to other types of films such as silicon oxide. Example metals that may be included in a metal-containing film include, but are not limited to, tungsten, titanium, ruthenium, tantalum, aluminum, iron, and hafnium. The metal-containing film may further include one or more of nitrogen, carbon, boron, oxygen, and hydrogen. In some embodiments, the metal containing film is metallic as in the case of an elemental metal.

Figure 3A:
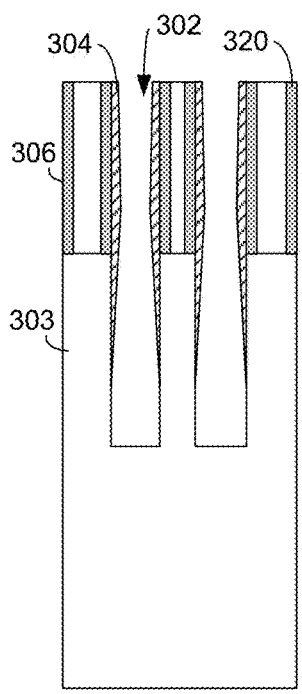
FIGS. 3A-3D depict etched cylinders in a semiconductor substrate as the cylinders are cyclically etched and coated with a protective sidewall coating according to various embodiments.
Figure 3B:
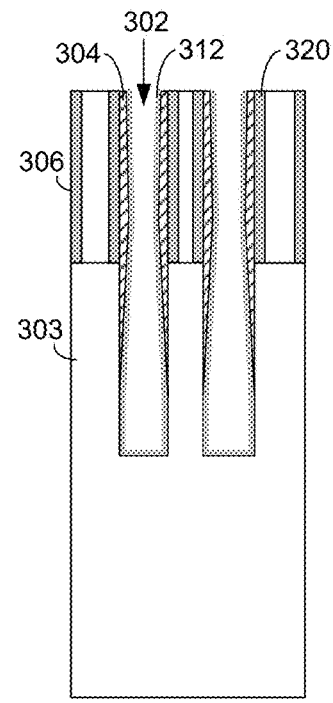
Figure 3C:
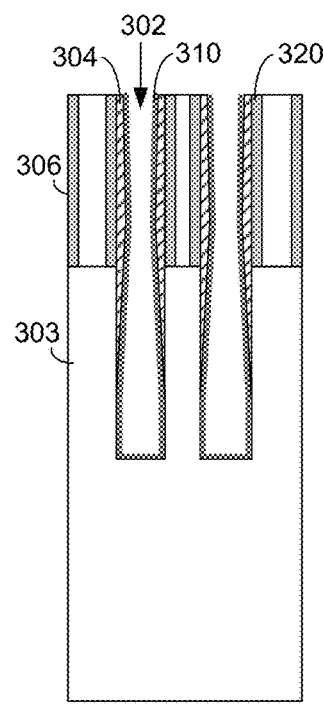

In various cases, the second sidewall coating 310 may be formed through a cyclic process resulting in a conformal film. In one embodiment where the second sidewall coating 310 is deposited through plasma assisted ALD methods, the deposition in operation 205 may include (a) flowing a first reactant into the reaction chamber and allowing the reactant to adsorb onto the surface of the substrate, thereby forming an adsorbed precursor layer 312; (b) optionally purging the reaction chamber (e.g., by sweeping with a purge gas, evacuating the reaction chamber, or both); (c) exposing the substrate to a plasma generated from an oxygen-containing and/or nitrogen-containing reactant (often provided with hydrogen, as well) to thereby drive a surface reaction to form a layer of the second sidewall coating 310 (this second sidewall coating 310 is typically an etch resistant film); (d) optionally purging the reaction chamber; and (e) repeating (a)-(d) to form additional layers of the second sidewall coating 310. The adsorbed precursor layer 312 is shown in FIG. 3B, and the second sidewall coating 310 is shown in FIG. 3C. The precursor adsorption (FIG. 3B) and film formation (FIG. 3C) may be cycled a number of times to form a film having a desired thickness.

Figure 2B:
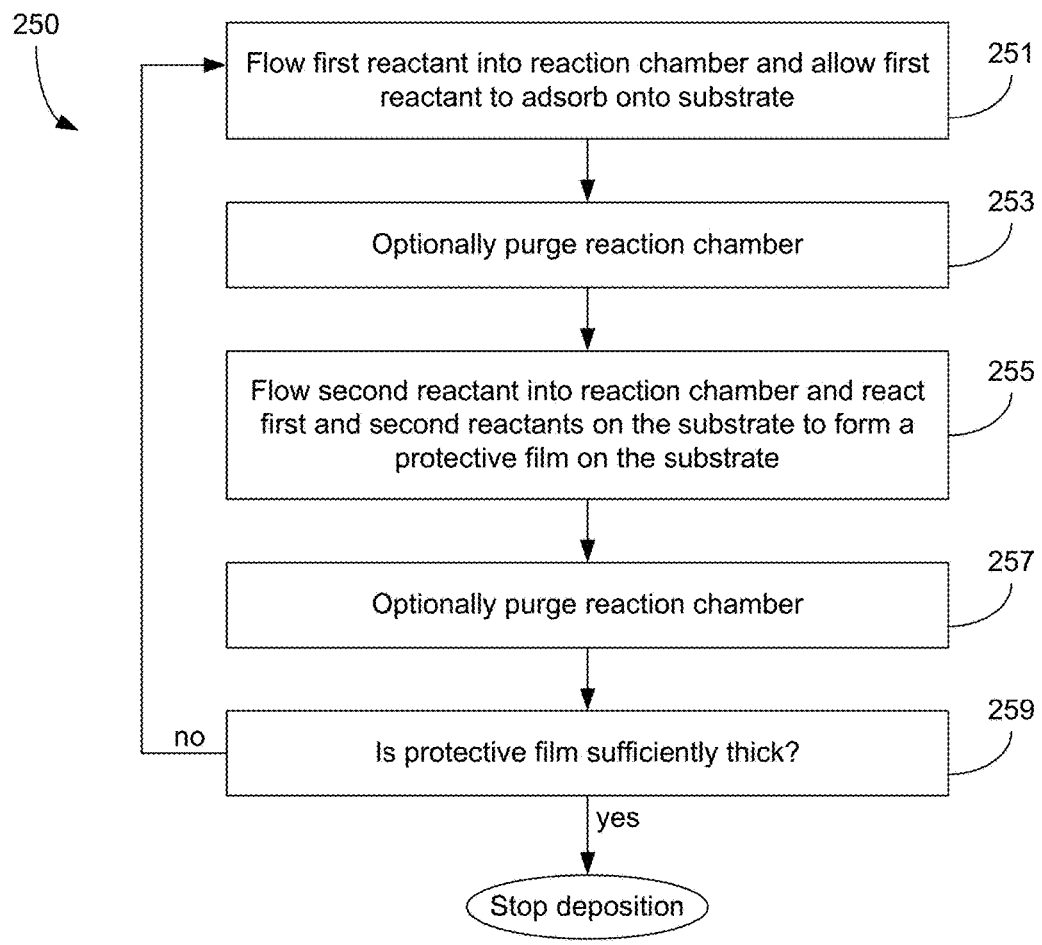
FIG. 2B presents a flowchart for a method of depositing a film (e.g., a mask shrink layer and/or a protective sidewall coating) according to certain embodiments.

FIG. 2B presents a flowchart for a method of depositing a film using ALD methods according to certain embodiments. The film may be a mask shrink layer such as the mask shrink layer 110 shown in FIGS. 1B-1D, and layer 320 in FIGS. 3A-3D, or it may be a protective sidewall coating such as the second sidewall coating 310 of FIGS. 3C and 3D. In some cases, the method shown in FIG. 2B is used both to deposit a mask shrink layer and to deposit a protective sidewall coating. The method 250 begins at operation 251 where a first reactant is flowed into the reaction chamber and allowed to adsorb onto the substrate. In various cases, the first reactant may be adsorbed to a degree that is less than fully saturated. In some other cases, the first reactant may be adsorbed until it reaches a substantially fully saturated state. Next, at operation 253 the reaction chamber may be optionally purged. The purge may include evacuating the chamber and/or sweeping the chamber with a non-reactive gas. When used, the purge may help avoid unwanted gas phase reactions between the first and second reactants. At operation 255, the second reactant is flowed into the reaction chamber and reacts with the first reactant on the substrate to form a protective film on the substrate.

In some embodiments, operation 255 occurs while plasma is present in the reaction chamber. Such methods may be referred to as plasma assisted atomic layer deposition methods or plasma enhanced atomic layer deposition methods. Where plasma is present in operation 255, the plasma energy may drive the reaction between the first and second reactants. In some other embodiments, operation 255 is accomplished without introducing plasma into the reaction chamber. In such implementations, the reaction between the first and second reactants may be driven by thermal energy. Often, the substrate is maintained at a relatively higher temperature where the reaction is driven by thermal energy, as opposed to plasma energy. The reaction in operation 255 is typically a surface reaction, not a gas phase reaction.

After the first and second reactants react with one another in operation 255, the reaction chamber may be optionally purged in operation 257. As with the purge in operation 253, the purge in operation 257 may occur through evacuating and/or sweeping the reaction chamber. At operation 259, it is determined whether the protective film has reached a sufficient thickness. Because each iteration of operations 251-257 results in deposition of a very thin (e.g., monolayer) of material, many iterations/cycles are typically used to build film thickness. Where the film is not yet sufficiently thick, the method continues at operation 251 where the first reactant is again introduced into the reaction chamber. Where the film has reached its final thickness, the method is complete and the deposition can be stopped.

In a number of embodiments herein, the first reactant is a metal-containing reactant such that the film formed in operation 255 is a metal-containing film. The second reactant may be a nitrogen-containing reactant and the film formed may be a metal nitride. The second reactant may be a boron-containing reactant and the film formed may be a metal boride. The second reactant may be a carbon-containing reactant and the film formed may be a metal carbide. The second reactant may be an oxygen-containing reactant and the film formed may be a metal oxide. In some cases, the second reactant may contain two or more of oxygen, nitrogen, carbon, and boron, and the film formed may include metal and two or more of oxygen, nitrogen, carbon, and boron. In some particular cases, the first reactant may be a metal-containing reactant and the second reactant may be any reactant that reacts with the first reactant to form a metal film. A certain degree of hydrogen or other elements may be incorporated into the metal film. In another particular embodiment, the layer formed in the method of FIG. 2B (e.g., the mask shrink layer and/or the protective sidewall coating) may be deposited as two sub-layers having different compositions, as discussed further below with respect to FIG. 2C.

In some implementations, a mask shrink layer and/or a protective sidewall layer may be a metal-containing polymer. The metal-containing polymer may be formed through a molecular layer deposition (MLD) reaction as described in U.S. application Ser. No. 14/724,574, incorporated by reference above. In some embodiments, a metal-containing polymer may be formed from a combination of an organic metal precursor and a diamine. In some other implementations, a protective layer may be a metal-containing polymer formed from a combination of an organic metal precursor and a diol.

Because the film formed in FIG. 2B is formed conformally, the film coats both the sidewalls and the bottom of the feature that is formed in the patterned mask (and, if etching has occurred in the dielectric-containing material, on the sidewalls of the partially etched feature). In various cases, the film formed should be resistant to mechanisms/conditions promoting lateral etch, and less resistant to mechanisms/conditions promoting vertical etch. This ensures that the sidewalls can be protected and that the etch process can begin or continue to etch the feature deeper into the substrate after deposition of the film described in relation to FIG. 2B (e.g., the mask shrink film and/or protective sidewall coating).

Films that are too resistant to vertical etch can undesirably function as an etch stop (preventing the feature from being etched further into the substrate), which is not desired. To this end, metal-containing films that form volatile species when exposed to fluorocarbon etch chemistry (e.g., the fluorocarbon etch chemistry used in the etching operations 201 and 211) may be particularly advantageous. Such volatile byproducts may form at the bottom of a feature when the feature is first subject to etching after deposition of the mask shrink film and/or the protective sidewall coating. Where the byproducts are volatile, they have a better chance of escaping from the partially etched feature, as opposed to becoming stuck on the feature sidewalls, for instance. Tungsten-containing films, titanium-containing films, and ruthenium-containing films may be particularly advantageous with respect to the etching chemistry and formation of volatile byproducts. Therefore, in certain embodiments, a mask shrink layer, and/or a protective sidewall coating (or a sub-layer therein) may include a metal selected from the group consisting of tungsten, titanium, ruthenium, and combinations thereof. The film may be a metal layer, an oxide layer, a nitride layer, a carbide layer, a boride layer, or some combination thereof.

Figure 3D:
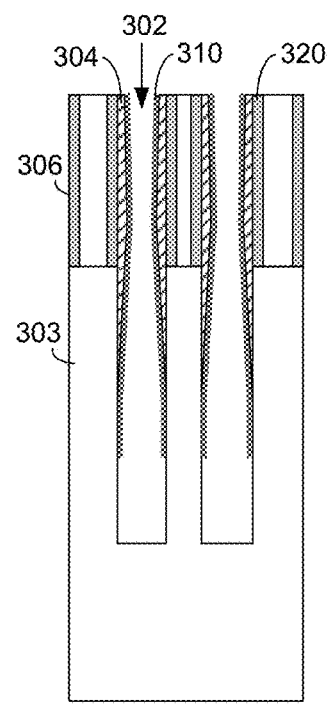

Returning to FIG. 2A, in another embodiment the second sidewall coating 310 may be deposited through CVD methods. In this case, the deposition in operation 205 may include flowing a reactant into the reaction chamber, optionally with a co-reactant (e.g., an oxygen-containing reactant, nitrogen-containing reactant, carbon-containing reactant, a boron-containing reactant, etc., optionally provided with hydrogen), while exposing the substrate to plasma. The plasma drives a gas phase reaction that results in deposition of the second sidewall coating 310. In this example, the method is represented by FIGS. 3A, 3C, and 3D (no adsorbed precursor layer 312 is formed, thus FIG. 3B is omitted).

In some embodiments, one or more of the reactants used to deposit the second sidewall coating 310 may have a particularly low sticking coefficient and/or loss coefficient. Sticking coefficient is a term used to describe the ratio of the number of adsorbate species (e.g., atoms or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. The fluorocarbon species such as those employed in conventional etch processes (and may form the first protective coating 304) have relatively high sticking coefficients, and therefore become concentrated near the top of the feature 302 where they first impinge upon the sidewalls. By comparison, species having lower sticking coefficients, even if they impinge upon the surface near the top of the sidewalls, are less likely to adsorb during each impact, and therefore have a greater probability of reaching the bottom portion of the feature 302.

Adsorption-based ALD methods are particularly suited for forming films that reaches the bottom of a patterned/etched feature because the reactant can be delivered until it substantially coats the entire sidewalls of the feature. The reactant does not build up near the top of the feature since only a monolayer of reactant typically adsorbs onto the surface during each cycle. Further, thermal deposition methods (as opposed to plasma deposition methods) are particularly advantageous because they generally achieve more uniform deposition results across the substrate, and more conformal results within a feature. However, both ALD and CVD methods, whether performed as thermal or plasma based deposition methods, are within the scope of the disclosed embodiments.

Returning to FIG. 2A, the method then repeats the operations of partially etching a feature in the substrate (operation 211, analogous to operation 201), and depositing the protective coating on sidewalls of the partially etched features (operation 215, analogous to operation 205). Next, at operation 219, it is determined whether the feature is fully etched. If the feature is not fully etched, the method repeats from operation 211 with additional etching and deposition of protective coatings. Once the feature is fully etched, the method is complete.

In various embodiments, the etching operation 201/211 and the protective sidewall coating deposition operation 205/215 are cyclically repeated a number of times. For instance, these operations may each occur at least twice (as shown in FIG. 2A), for example at least about three times, or at least about 5 times. In some cases, the number of cycles (each cycle including etching operation 201 and protective sidewall coating deposition operation 205, with etching operation 211 and deposition operation 215 counting as a second cycle) is between about 2-10, for example between about 2-5. Each time the etching operation occurs, the etch depth increases. The distance etched may be uniform between cycles, or it may be non-uniform. In certain embodiments, the distance etched in each cycle decreases as additional etches are performed (i.e., later performed etching operations may etch less extensively than earlier performed etching operations). The thickness of the second sidewall coating 310 deposited in each deposition operation 205 may be uniform between cycles, or the thickness of such coatings may vary. Example thicknesses for the second sidewall coating 310 during each cycle may range between about 1-10 nm, for example between about 3-5 nm. Further, the type of coating that is formed may be uniform between the cycles, or it may vary. In one example, a boron nitride sidewall coating is formed during a first cycle of operation 205, and a boron oxide sidewall coating is formed during a second cycle of operation 205. In some embodiments, the protective sidewall coating deposited in operations 205 and/or 215 may be deposited as a bilayer, as discussed in relation to FIG. 2C. The sub-layers of the bilayer may have different compositions.

As noted above, in some implementations, no protective sidewall coating is deposited. In this case, the method may occur as shown in FIG. 1E, with the etching operation occurring in a single process.

Figure 2C:
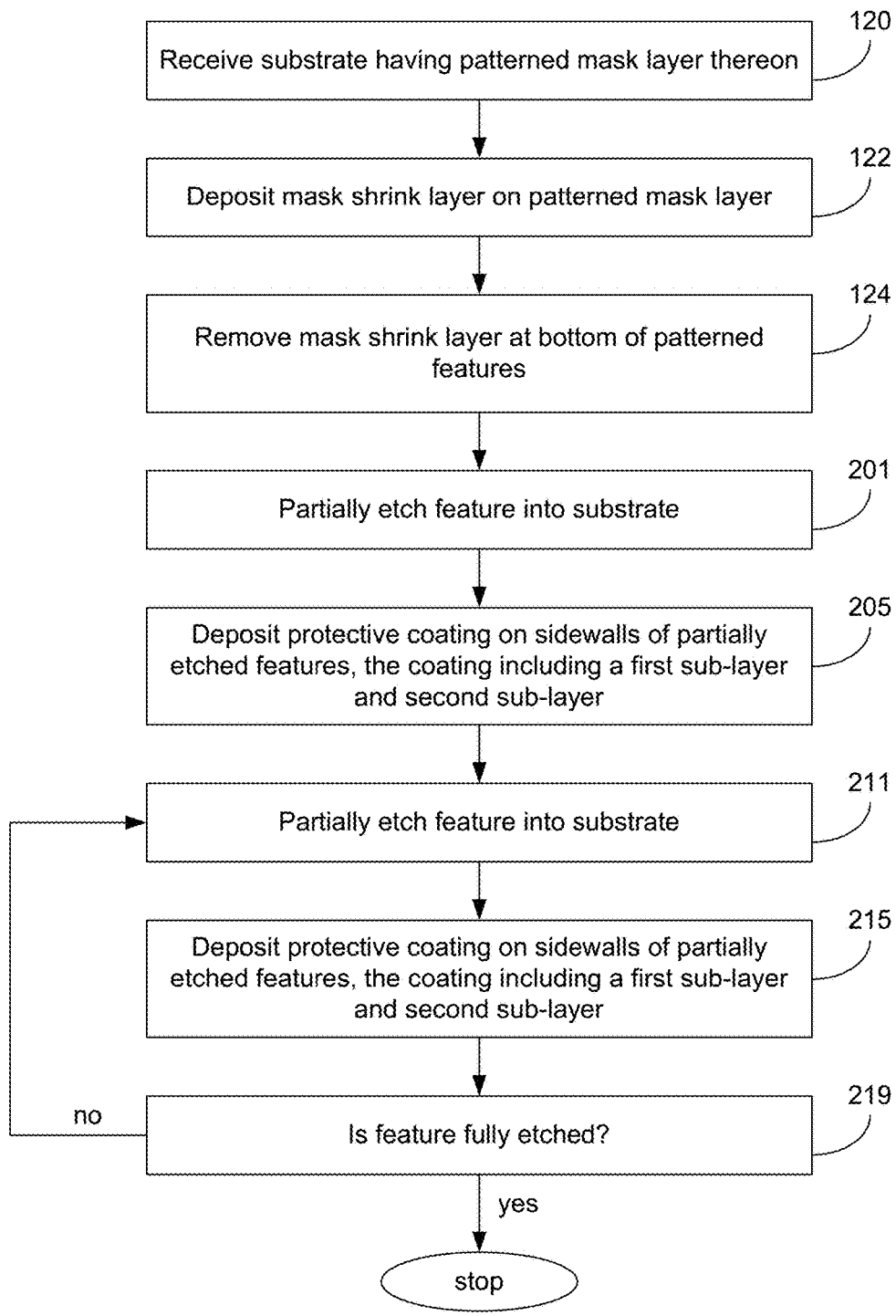
FIG. 2C presents a flowchart for a method of forming an etched feature on a semiconductor substrate according to embodiments where a protective sidewall coating is deposited as a bilayer.

FIG. 2C presents a flowchart for a method of etching a feature into a substrate using a multi-step process similar to that described in FIG. 2A. For the sake of brevity, only the differences will be described. The method of FIG. 2C differs from that of FIG. 2A in that the protective coating deposited on the sidewalls of partially etched features (e.g., in operations 205 and 215) is deposited as a bilayer. The bilayer includes materials that are deposited during the deposition steps, and does not include materials that may build up on the sidewalls during the etching steps. The bilayer includes two sub-layers that differ in some respect. Each of the sub-layers of the bilayer is deposited conformally. In various cases, the first sub-layer may be deposited before the second sub-layer, and may be deposited under different conditions than the second sub-layer. Such conditions may relate to substrate temperature, the use of plasma, plasma power and/or frequency, reactants, flow rates, pressure, dose times, purge times, etc. Each sub-layer may be deposited according to the methods described herein. In some cases, one or both of the sub-layers may be deposited using ALD methods. In such cases, the sub-layer(s) deposited through ALD may be deposited according to the method 250 shown in FIG. 2B.

In a number of cases, the first sub-layer may have a different composition than the second sub-layer. For example, the first sub-layer may be a metal nitride, metal carbide, metal boride, a metal oxide, etc., and the second sub-layer may be a metal layer. The second sub-layer may also be a metal nitride, metal carbide, metal boride, metal oxide, etc., having a different composition than the first sub-layer. The bilayer approach may be particularly beneficial in that the protective layer can be deposited to achieve a number of characteristics. For example, a first sub-layer may be deposited to achieve smooth coverage and/or high quality adhesion to the underlying layer (due to characteristics of the first sub-layer), and a second sub-layer may be deposited to achieve high quality sidewall protection (due to characteristics of the second sub-layer). For instance, in some cases a metal film exhibits high quality sidewall protection properties, but is difficult to deposit directly on the sidewalls. Such difficulty may relate to the properties of the material defining the sidewalls after the feature is partially etched. In such cases, it may be beneficial to deposit the protective sidewall film to include two sub-layers: a metal-containing first sub-layer that can be easily deposited on the sidewalls after etching, and a metal-containing second sub-layer that can be easily deposited on the first sub-layer, and that provides high quality sidewall protection during etching. The first and/or second sub-layers may be metal nitrides, metal oxides, metal carbides, metal borides, or elemental metals. Other elements (including but not limited to hydrogen) may be also be present in the sub-layers.

In some embodiments, the first sub-layer is a metal nitride, metal carbide, metal oxide, or metal boride, and the second sub-layer is a metal that is substantially in elemental form (as used herein, the phrase substantially in elemental form means at least about 90% (atomic) elemental metal). Where metal is present in both the first and second sub-layers, the metal in the first sub-layer may be the same or different from the metal in the second sub-layer. In a particular embodiment, the first sub-layer is tungsten nitride and the second sub-layer is tungsten.

As mentioned, one or more of the sub-layers may be deposited through ALD, for example according to method 250 of FIG. 2B. In one example, the first sub-layer is deposited through method 250 using a first set of deposition conditions, and the second sub-layer is deposited on the first sub-layer through method 250 using a second set of deposition conditions, where at least one deposition condition is different between the first and second set of deposition conditions. In various cases, the first and second sub-layers are deposited using a different set of reactants. The first and second sub-layers may be deposited in the same reaction chamber or in different reaction chambers. Either or both of the first and second sub-layers may be deposited in the same reaction chamber used to practice the etching operations described herein. In a particular embodiment, a first reaction chamber is used to perform etching, a second reaction chamber is used to deposit the first sub-layer, and a third reaction chamber is used to deposit the second sub-layer. The various reaction chambers may be provided in separate tools, or in a single tool, for example one having a cluster architecture including an appropriate vacuum transfer module to ensure that all processing can be done without exposing the substrate to the atmosphere. In some implementations, a reaction chamber used to deposit a metal-containing film (e.g., a metal nitride, metal carbide, metal boride, or metal oxide) may be a reactor from the ALTUS® family of products (including but not limited to the ALTUS® DirectFill™ Max) available from Lam Research Corporation of Fremont, Calif. In these or other implementations, a reaction chamber used to deposit a metal film (e.g., tungsten, titanium, ruthenium, tantalum, aluminum, iron, hafnium, etc.) may be a reactor from the ALTUS® family of products (including but not limited to the ALTUS® ICE), also available from Lam Research Corporation.

The first and second sub-layers may be deposited to particular thicknesses. In some examples, the first sub-layer may be deposited (during each iteration of operation 205 and 215) to a thickness between about 0.3-5 nm, for example between about 1-3 nm. In these or other cases, the second sub-layer may be deposited to a thickness between about 0.3-5 nm, for example between about 1-3 nm. The overall thickness of the bilayer may be between about 0.6-10 nm, for example between about 0.6-8 nm.

In further embodiments, the protective sidewall coating may be deposited as a layer having three or more sub-layers. Each of the sub-layers may be deposited conformally, through any of the methods and using any of the protective sidewall coating materials described herein.

While the multiple sub-layer approach is described above in terms of the protective sidewall coating, such techniques may also be used when depositing the mask shrink layer. Details described herein with respect to the sub-layers of a protective sidewall coating (including, but not limited to, materials, thicknesses, deposition techniques, deposition parameters, etc.) may also apply to sub-layers of a mask shrink layer.

The mask shrink layer deposition operation 122, the mask shrink punch through operation 124, the etching operation 201/211 and the deposition operation 205/215 may occur in the same reaction chamber or in different reaction chambers. In one example, the deposition operations 122/205/215 occur in one or more reaction chambers configured to perform deposition, and the removal/etching operations 124/201/211 occur in one or more reaction chambers configured to perform etching, with the reaction chamber(s) configured to perform deposition and the reaction chamber(s) configured to perform etching together forming a multi-chamber processing apparatus such as a cluster tool. Loadlocks and other appropriate vacuum seals may be provided for transferring the substrate between the relevant chambers in certain cases. The substrate may be transferred by a robot arm or other mechanical structure. A reaction chamber configured to perform etching may be a Flex™ reaction chamber, for example from the 2300® Flex™ product family available from Lam Research Corporation of Fremont, Calif. A reaction chamber configured to perform deposition may be chamber from the Vector® product family or the Altus® product family, both available from Lam Research Corporation. The use of a combined reactor for both etching and deposition operations may be beneficial in certain embodiments as the need to transfer the substrate is avoided. The use of different reactors for etching and deposition operations may be beneficial in other embodiments where it is desired that the reactors are particularly optimized for each operation. The relevant reaction chambers are discussed further below.

As noted, the deposition operation for depositing the protective sidewall coating helps optimize the etching operation by forming a deeply penetrating protective layer that minimizes or prevents lateral etch of the feature during the etching operation. This promotes formation of etched features having very vertical sidewalls with little or no bowing. In certain implementations, a final etched feature having an aspect ratio of at least about 80 has a bow less than about 60% (measured as the widest critical dimension−narrowest critical dimension below that/narrowest critical dimension below that*100). For example, a feature having a widest CD of 50 nm and a narrowest CD of 40 nm (the 40 nm CD being positioned below the 50 nm CD in the feature) has a bow of 25% (100*(50 nm−40 nm)/40 nm=25%). In another implementation, a final etched feature having an aspect ratio of at least about 40 has a bow less than about 20%.

After the feature is etched to its final depth, it may be beneficial in certain implementations to remove any mask shrink layer and/or remaining sidewall coating before further processing steps. These films may be removed via a wet clean process. The wet clean process may involve applying a liquid cleaning agent such as an oxidizing acid or organic/aqueous mixture to the substrate to remove any unwanted residues. The residue removal may be relatively more difficult where the film being cleaned away is a metal-containing film, as opposed to other film types such as silicon oxide, boron nitride, or hydrocarbon polymer.

Mask shrink residues and protective sidewall coating residues may be removed to facilitate/enable further processing steps. In the context of forming a DRAM device, a metal sleeve is typically deposited on the sidewalls of the fully etched cylinder to form a capacitor. Any residue from a protective sidewall coating can get in the way of this metal sleeve, and can make it difficult to form the metal sleeve as a smooth surface with the targeted properties. In the context of forming a 3D NAND device having alternating layers of oxide and nitride (an ONON 3D NAND device), the nitride layers are typically removed through a wet chemistry process. Sidewall residues can make this nitride removal much more difficult. In the context of forming a 3D NAND device having alternating layers of oxide and polysilicon (an OPOP 3D NAND device), sidewall residues may deleteriously affect the process/results related to filling the etched feature. In any case, it is generally desirable to remove sidewall residues after the feature is etched to its final depth.

VI. Materials and Parameters of the Process Operations

A. Substrate

The methods disclosed herein are particularly useful for etching semiconductor substrates having dielectric materials thereon. Example dielectric materials include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. As noted above, the dielectric material that is etched may include more than one type/layer of material. In particular cases, the dielectric material may be provided in alternating layers of SiN and $SiO_2$ or alternating layers of polysilicon and $SiO_2$. Further details are provided above. The substrate may have an overlying mask layer that defines where the features are to be etched. In certain cases, the mask layer is Si, and it may have a thickness between about 500-1500 nm. Carbon-based mask layers may also be used in various cases.

B. Mask Shrink Layer

The material of the mask shrink layer should have certain qualities. For example, the material of the mask shrink layer should exhibit a similar etch rate as the material of the mask layer. For example, where the mask layer is polycrystalline silicon, the mask shrink layer should etch at a fairly similar rate as the polycrystalline silicon under the conditions used to etch the dielectric-containing stack. If the mask shrink layer is too resistant to the etch conditions, it could form pillars along the sidewall of the mask. As the mask layer is consumed during the etch process, such mask shrink pillars could become unstable and break off, potentially blocking further etch of the cylinders. If the mask shrink layer is insufficiently resistant to the etch conditions, it could be undesirably etched away during the etching process, such that it is not able to effectively control the critical diameter of the features that form in the dielectric-containing stack. In certain embodiments, the material used for the mask shrink layer etches at a rate that is between about 0.5-2 times the rate at which the mask material etches, under the conditions used to etch the features into the dielectric-containing materials.

Further, the material used for the mask shrink layer should be capable of being punched through/removed at the bottom of the patterned features, to thereby allow the features to be etched into the dielectric-containing stack. Otherwise, the mask shrink layer could undesirably act as an etch stop, preventing the features from being etched into the dielectric-containing stack. Example process conditions for performing this punch through/removal step are discussed further below.

The mask shrink layer should be deposited conformally, with a high degree of repeatability and high uniformity over the face of the wafer. With respect to conformality within a patterned feature (e.g., along the sidewalls of the patterned feature), the mask shrink layer in various embodiments has a conformality of at least about 0.3 or at least about 0.7. Similarly, the mask shrink layer should not be deposited using a film or process that results in a substantially bottom-heavy deposition (e.g., thick deposition at the bottom of the patterned feature and much thinner deposition on the sidewalls). Such bottom-heavy films are more difficult to punch through/remove at the bottom of the patterned features, and provide a relatively lower benefit in terms of shrinking the mask layer. As such, the mask shrink layer should be deposited in a manner that does not result in excessive deposition on the bottom of the patterned features. Further, the mask shrink layer should be deposited with a high degree of smoothness in order to avoid striations in a final etching result or device.

In various embodiments, the mask shrink layer is a metal-containing film. For example, the metal in the metal-containing film may be tungsten, titanium, ruthenium, tantalum, aluminum, iron, and/or hafnium. In some embodiments, the metal-containing film may further include one or more of nitrogen, carbon, boron, oxygen, and hydrogen. For instance, the metal-containing film may be a metal nitride, a metal oxide, a metal boride, a metal carbide, etc. Both stoichiometric and non-stoichiometric films are contemplated. The metal-containing film may be doped or undoped. In some embodiments, the metal-containing film is metallic, as in the case of an elemental metal. In one example, the mask shrink layer is a tungsten nitride film.

A number of different techniques may be used to deposit the mask shrink layer. Such processes are described in further detail below. Generally speaking, the qualities that make a material suitable as a protective sidewall coating are similar to those that make a material suitable as a mask shrink layer (though the mask shrink layer may have additional constraints, e.g., relative etch rate, as described in this section). Therefore, details described herein with respect to the material/structure/deposition technique/deposition conditions for the protective sidewall coating may also apply to the mask shrink layer.

C. Etching Process

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate. Ions in the plasma are directed toward the wafer and cause the dielectric material to be etched away upon impact.

In some embodiments, the features are etched into the dielectric-containing stack in a single process, as described in relation to FIG. 1E. In some other embodiments, the etching process is done in a cyclic manner, with periodic deposition of a sidewall protective coating as the feature is etched deeper into the dielectric-containing stack.

Regardless of how the etching process is implemented, certain process conditions may be used to punch through/remove the mask shrink layer (and/or a protective sidewall coating in some cases) at the bottom of patterned/etched features, as discussed further below. In cases where the features are etched into the dielectric stack in multiple separate etching operations (e.g., as shown in FIG. 2A), these punch through process conditions may only be practiced a single time, for example right after deposition of the mask shrink layer. In some other cases using cyclic deposition/etching, the punch through conditions may be practiced multiple times. In one example, the punch through conditions are used any time a metal-containing film (e.g., a mask shrink film or a protective sidewall film) is deposited directly on top of a silicon nitride layer. This silicon nitride layer may be the top layer in a memory device stack (e.g., the top layer in the dielectric-containing stack 103 of FIG. 1A), or it may be a silicon nitride layer positioned somewhere within the stack of dielectric-containing materials. The conditions typically used when etching the silicon nitride layers in the dielectric-containing stack may not be sufficient to break through a metal-containing layer deposited at the bottom of a feature, hence the use of a special set of processing conditions for this step. By contrast, where a metal-containing film (e.g., a protective sidewall coating) is deposited on a silicon oxide layer, there may be no need to etch under special conditions to break through the metal-containing film. This may be because the conditions used to etch the oxide layers are sufficient to punch through/remove any film deposited at the bottom of the features. On a similar note, the benefit associated with performing a breakthrough step decreases as the feature is etched further into the substrate, since the film typically deposits somewhat thinner at higher aspect ratios. This thinner deposition means that the film is easier to punch through, and no special process conditions may be needed. Particular conditions used to punch through a mask shrink layer and/or protective sidewall coating are discussed further below.

Example apparatus that may be used to perform the etching process include the 2300® FLEX™ product family of reactive ion etch reactors available from Lam Research Corporation of Fremont, Calif. This type of etch reactor is further described in the following U.S. Patents, each of which is herein incorporated by reference in its entirety: U.S. Pat. No. 8,552,334, and U.S. Pat. No. 6,841,943.

Various reactant options are available to etch the features into the dielectric material. In certain cases, the etching chemistry includes one or more fluorocarbons. In these or other cases, the etching chemistry may include other etchants such as $NF_3$. One or more co-reactants may also be provided. In some cases oxygen ($O_2$) is provided as a co-reactant. The oxygen may help moderate formation of a protective polymer sidewall coating (e.g., the first sidewall coating 304 of FIGS. 3A-3D).

In certain implementations, the etching chemistry includes a combination of fluorocarbons and oxygen. For instance, in one example the etching chemistry includes $C_4F_6$, $C_4F_8$, $N_2$, CO, $CF_4$, and $O_2$. Other conventional etching chemistries may also be used, as may non-conventional chemistries. The fluorocarbons may flow at a rate between about 0-500 sccm, for example between about 10-200 sccm. Where $C_4F_6$ and $C_4F_8$ are used, the flow of $C_4F_6$ may range between about 10-200 sccm and the flow of $C_4F_8$ may range between about 10-200 sccm. The flow of oxygen may range between about 0-500 sccm, for example between about 10-200 sccm. The flow of nitrogen may range between about 0-500 sccm, for example between about 10-200 sccm. The flow of tetrafluoromethane may range between about 0-500 sccm, for example between about 10-200 sccm. The flow of carbon monoxide may range between about 0-500 sccm, for example between about 10-200 sccm. These rates are appropriate in a reactor volume of approximately 50 liters that is used to process a single 300 mm wafer. The flow rates herein may be scaled as appropriate for reactors of different sizes, and may be scaled linearly based on substrate area for substrates of other sizes.

In some embodiments, the substrate temperature during etching is between about 0-160° C. In some embodiments, the pressure during etching is between about 5-50 mTorr. The ion energy may be relatively high, for example between about 1-10 kV. The ion energy is determined by the applied RF power. In various cases, dual-frequency RF power is used to generate the plasma. Thus, the RF power may include a first frequency component (e.g., about 2 MHz) and a second frequency component (e.g., about 60 MHz). Different powers may be provided at each frequency component. For instance, the first frequency component (e.g., about 2 MHz) may be provided at a power between about 3-20 kW, for example about 10 kW, and the second frequency component (e.g., about 60 MHz) may be provided at a lower power, for example between about 0.5-7 kW, for example about 1 kW. These power levels assume that the RF power is delivered to a single 300 mm wafer. The power levels can be scaled linearly based on substrate area for additional substrates and/or substrates of other sizes (thereby maintaining a uniform power density delivered to the substrate). In some cases, a combination of three different frequencies of RF power may be employed, for example using a third frequency (e.g. about 27 MHz) intermediate between the first and second frequency components described above. This third frequency may be provided at a lower power than the first frequency, for example between about 0-4 kW, for example about 2 kW. In some embodiments, the RF power provided to the reactor may be pulsed, such that the RF power level at one or more of the frequencies cyclically alternates between a higher power and lower power with a repetition rate in the range 10-10,000 Hz. In some such cases, the higher powers used during pulsing may correspond to the power levels listed in this paragraph, and the lower powers used during pulsing may be between about 0-50% of the power levels listed in this paragraph. In some cases, RF power at one or more frequencies may be pulsed between a high power level and a low power level, where the low power level delivers between about 0-50% the power of the high power level. These process conditions are useful for etching the features into the dielectric material in many embodiments. As noted above, a modified set of processing conditions may be used to punch through a mask shrink layer and/or a protective sidewall coating.

In order to punch through a layer deposited at the bottom of the patterned/etched feature, the etching conditions described above may be modified to achieve a high degree of substrate bias and a low degree of polymerization. For example, the process gas mixture employed may be modified to remove gases that promote or otherwise result in relatively higher polymerization. Such gases may be replaced with gases that promote or otherwise result in relatively lower polymerization. For instance, in one example a mixture of $CHF_3$, $CF_4$, and/or $O_2$ may be employed. Where $CHF_3$ and/or $CF_4$ are employed, the flow of $CHF_3$ may range between about 10-200 sccm and the flow of $CF_4$ may range between about 10-200 sccm. Where $O_2$ is employed, the flow of $O_2$ may range between about 2-30 sccm. In some embodiments, the pressure during etching is between about 5-100 mTorr. The RF power delivery used for the breakthrough process may utilize the combinations of 2 or 3 different frequencies, with the ranges (e.g., frequency ranges and power ranges) described above. Also, RF pulsing may be employed in some cases, as described above. The RF powers are in ranges similar to those described above, with one exception: the first frequency component (e.g., about 2 MHz) may be provided at a power that is somewhat lower than the range described above, for example between about 1-20 kW.

In cases where the etching process occurs cyclically, each cycle of the etching process etches the dielectric material to some degree. The distance etched during each cycle may be between about 10-500 nm, for example between about 50-200 nm. The total etch depth will depend on the particular application. For some cases (e.g., DRAM) the total etch depth may be between about 1.5-2 μm. For other cases (e.g., 3D NAND) the total etch depth may be at least about 3 μm, for example at least about 4 μm. In these or other cases, the total etch depth may be about 5 μm or less.

As explained in the discussion of FIGS. 3A-3D, the etching process can produce a first sidewall coating (e.g., first sidewall coating 304, which may be polymeric). However, the depth of this sidewall coating may limited to the area near the upper portion of the feature, and may not extend all the way down into the feature where the sidewall protection is also needed. Thus, a separate deposition operation may be performed, as described herein, to form a sidewall coating that covers substantially the entire depth of the etched feature. In other cases this deposition operation is omitted, and the features are etched into the dielectric-containing stack in a single process.

D. Deposition Process for Depositing the Protective Sidewall Coating and/or Mask Shrink Film The deposition processes described in this section may relate to deposition of the mask shrink film and/or to deposition of the protective sidewall coating. In the case of a mask shrink film, the deposition is performed primarily to deposit the mask shrink film on the sidewalls of the patterned mask layer. Similarly, in the case of a protective sidewall film, the deposition is performed primarily to deposit a protective layer on the sidewalls of the partially etched features, such partially etched features being formed within the dielectric-containing stack.

The layer being deposited should extend deep into the patterned/etched feature, even in high aspect ratio features. In many cases, a mask layer may be sufficiently thick, and the features sufficiently narrow, that the openings in the patterned mask layer are considered high aspect ratio openings/features. In one example, the openings in the mask layer have a critical dimension of about 35 nm and a depth of about 2 microns, which represents an aspect ratio that is greater than 50. Reaction mechanisms that rely on adsorption-limited deposition (e.g., ALD reactions) can promote formation of the film deep within the etched features. With respect to a mask shrink layer, this layer is deposited after the mask layer is patterned, and typically before the pattern is etched into the dielectric-containing stack. With respect to a protective sidewall coating, deposition typically begins after the feature is partially etched. As noted in the discussion of FIG. 2A, the deposition operation may be cycled with the etching operation to form additional sidewall protection as the feature is etched deeper into the dielectric material.

In some cases, deposition of the protective layer begins at or after the feature is etched to at least about ⅓ of its final depth. In some embodiments, deposition of the protective layer begins once the feature reaches an aspect ratio of at least about 2, at least about 5, at least about 10, at least about 15, at least about 20, or at least about 30. In these or other cases, the deposition may begin before the feature reaches an aspect ratio of about 4, about 10, about 15, about 20, about 30, about 40, or about 50. In some embodiments, deposition begins after the feature is at least about 1 μm deep, or at least about 1.5 μm deep (e.g., in 3D NAND embodiments where the final feature depth is 3-4 μm). In other embodiments, deposition begins after the feature is at least about 600 nm deep, or at least about 800 nm deep (e.g., in DRAM embodiments where the final feature depth is 1.5-2 μm deep). The optimal time for initiating deposition of the protective layer is immediately before the sidewalls would otherwise become etched to an undesirably large CD, thereby forming a bow. The exact timing of this occurrence depends on the shape of the feature being etched, the material being etched, the chemistry used to etch and to deposit the protective layer, and the process conditions used to etch and deposit the relevant materials.

The mask shrink layer and/or the protective layer that forms during the deposition process may have various compositions. As explained, these layers should penetrate deep into an etched feature, and should be relatively resistant to the etching chemistry used to etch the feature. In various cases, the mask shrink layer and/or the protective sidewall coating may be a metal-containing layer. Other types of protective layers (including but not limited to organic polymeric layers and silicon oxide layers) may also be used, for example as described in the following U.S. Patent Applications, each of which is herein incorporated by reference in its entirety: U.S. patent application Ser. No. 14/724,574, filed May 28, 2015, and titled "TECHNIQUE TO DEPOSIT SIDEWALL PASSIVATION FOR HIGH ASPECT RATIO CYLINDER ETCH," and U.S. patent application Ser. No. 14/697,521, filed Apr. 27, 2015, and also titled "TECHNIQUE TO DEPOSIT SIDEWALL PASSIVATION FOR HIGH ASPECT RATIO CYLINDER ETCH." In certain embodiments, the mask shrink layer and/or the protective layer that forms during the deposition process may be a tungsten nitride layer. Deposition of tungsten nitride is further discussed in U.S. Pat. No. 7,691,749, which is herein incorporated by reference in its entirety.

Where the deposited film includes boron, a boron-containing reactant may be used. Example boron-containing reactants include, but are not limited to, triisopropyl borate ($[(CH_3)_2CHO]_3B$), trimethylboron-$d_9$ ($B(CD_3)_3$), triphenylborane (($C_6H_5)_3B$), and tris(pentafluorophenyl)borane (($C_6F_5)_3B$). Other examples of boron-containing reactants include boron trichloride ($BCl_3$), borane ($BH_3$), diborane ($B_2H_6$), boron trifluoride ($BF_3$), and trimethyl borate ($B(OCH_3)_3$). In a particular example, a boron-containing reactant is selected from the group consisting of: $B_2H_6$, $BCl_3$, $BF_3$, and combinations thereof. Cyclic ALD or ALD-like deposition reactions may deposit the boron-containing protective layer. Alternatively, non-cyclic processes such as bulk CVD deposition may deposit the boron-containing protective layer.

Where the deposited film includes nitrogen, a nitrogen-containing reactant may be used. A nitrogen-containing reactant contains at least one nitrogen, for example, nitrogen, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Other examples include $N_xO_y$ compounds such as nitrous oxide ($N_2O$), nitric oxide (NO), nitrogen dioxide ($NO_2$), dinitrogen trioxide ($N_2O_3$), dinitrogen tetroxide ($N_2O_4$) and/or dinitrogen pentoxide ($N_2O_5$).

Where the deposited film includes oxygen, an oxygen-containing reactant may be used. Examples of oxygen-containing reactants include, but are not limited to, oxygen, ozone, nitrous oxide, nitric oxide, nitrogen dioxide, dinitrogen trioxide, dinitrogen tetroxide, dinitrogen pentoxide, carbon monoxide, carbon dioxide, sulfur oxide, sulfur dioxide, oxygen-containing hydrocarbons ($C_xH_yO_z$), water, formaldehyde, carbonyl sulfide, mixtures thereof, etc.

Where the deposited film includes carbon, a carbon-containing reactant may be used. Examples of carbon-containing reactants include, but are not limited to, hydrocarbons ($C_xH_y$) oxygen-containing hydrocarbons ($C_xH_yO_z$), carbonyl sulfide, carbon disulfide, fluorocarbons, etc.

Where the deposited film includes metal, a metal-containing reactant may be used. Example metals include, but are not limited to, tungsten, titanium, tantalum, ruthenium, aluminum, iron, and hafnium.

Example aluminum-containing reactants include, but are not limited to, aluminum tris(2,2,6,6-tetramethyl-3,5-heptanedionate), triisobutylaluminum, trimethylaluminum, and tris(dimethylamido)aluminum(III), etc.

Example tungsten-containing reactants include, but are not limited to, bis(butylcyclopentadienyl)tungsten(IV) diiodide, bis(tert-butylimino)bis(tert-butylamino)tungsten, bis(tert-butylimino)bis(dimethylamino)tungsten(VI), bis(cyclopentadienyl)tungsten(IV) dichloride, bis(cyclopentadienyl)tungsten(IV) dihydride, bis(isopropylcyclopentadienyl)tungsten(IV) dihydride, cyclopentadienyltungsten(II) tricarbonyl hydride, tetracarbonyl(1,5-cyclooctadiene)tungsten(0), triamminetungsten(IV) tricarbonyl, tungsten hexacarbonyl, tungsten hexafluoride, etc.

Example titanium-containing reactants include, but are not limited to, bis(tert-butylcyclopentadienyl)titanium(IV) dichloride, tetrakis(diethylamido)titanium(IV), tetrakis(dimethylamido)titanium(IV), tetrakis(ethylmethylamido)titanium(IV), titanium(IV) diisopropoxidebis(2,2,6,6-tetramethyl-3,5-heptanedionate), titanium(IV) isopropoxide, titanium tetrachloride, etc.

Example tantalum-containing reactants include, but are not limited to, pentakis(dimethylamino)tantalum(V), tantalum(V) ethoxide, tris(diethylamido)(tert-butylimido)tantalum(V), tris(ethylmethylamido)(tert-butylimido)tantalum(V), etc.

Example ruthenium-containing reactants include, but are not limited to, bis(cyclopentadienyl)ruthenium(II), bis(ethylcyclopentadienyl)ruthenium(II), bis(pentamethylcyclopentadienyl)ruthenium(II), triruthenium dodecacarbonyl, etc.

Example iron-containing reactants include, but are not limited to, [1,1'-bis(diphenylphosphino)ferrocene]tetracarbonylmolybdenum(0), bis(pentamethylcyclopentadienyl)iron(II), 1,1'-diethylferrocene, iron(0) pentacarbonyl, iron(III) tris(2,2,6,6-tetramethyl-3,5-heptanedionate), etc.

Example hafnium-containing reactants include, but are not limited to, bis(tert-butylcyclopentadienyl)dimethylhathium(IV), bis(methyl-η5-cyclopentadienyl)dimethylhathium, bis(methyl-η5-cyclopentadienyl)methoxymethylhafnium, bis(trimethylsilyl)amidohathium(IV) chloride, dimethylbis(cyclopentadienyl)hafnium(IV), hafnium(IV) tert-butoxide, hafnium isopropoxide isopropanol, tetrakis(diethylamido)hafnium(IV), tetrakis(dimethylamido)hafnium(IV), tetrakis(ethylmethylamido)hafnium(IV), etc.

The reactants listed in this section may be used to deposit the mask shrink layer and/or a protective sidewall coating. Similarly, the techniques (e.g., ALD, CVD, MLD, etc.) and process conditions (e.g., reactant flows, timing, temperatures, pressures, plasma characteristics, etc.) listed in this section may be used to deposit a mask shrink layer and/or a protective sidewall coating. Generally speaking, metal-containing films that perform well as protective sidewall coatings also perform well as mask shrink layers (so long as the material of the mask shrink layer has an appropriate etch rate compared to the mask layer). Therefore, details provided herein about the protective sidewall coating may also apply to the mask shrink layer.

The disclosed precursors are not intended to be limiting. Other reactants may also be used as known by those of ordinary skill in the art. Frequently, oxygen may be provided along with one or more of the reactants. In some embodiments, a mask layer used to define the features on the substrate may be sensitive to oxidation. Carbon-based mask materials may be particularly sensitive to damage arising from oxidation during the deposition step. Methods for reducing damage to oxidation-sensitive mask materials are discussed in U.S. patent application Ser. No. 14/697,521, which is incorporated by reference above. In certain embodiments herein, a metal oxide mask shrink layer and/or protective layer may be formed using a combination of a metal-containing reactant and carbonyl sulfide (COS). Carbonyl sulfide has been shown to form oxides without damaging oxidation-sensitive mask materials.

In some embodiments, the mask shrink layer and/or the protective sidewall coating (or one or more sub-layers therein) may be made of a material selected from the group consisting of tungsten nitride, tungsten, titanium nitride, titanium oxide, tantalum, iron boride, and hafnium boride. In some of these embodiments, the mask shrink layer and/or the protective sidewall coating (or one or more sub-layers therein) may be made of a material selected from the group consisting of tungsten nitride, tungsten, titanium nitride, titanium oxide, tantalum, and tungsten. In a particular example the mask shrink layer and/or the protective sidewall coating is made of tungsten nitride. In another example the mask shrink layer and/or the protective sidewall coating is made of two sub-layers, a first sub-layer of tungsten nitride or another metal-containing film and a second sub-layer of tungsten or another metal.

A few particular examples of reactant combinations will be provided, though these examples are not intended to be limiting. In one example, a tungsten nitride layer (or sub-layer) may be formed using $WF_6$ and $NH_3$. In some implementations, a tungsten layer (or sub-layer) may be formed using $WF_6$ and $H_2$.

The precursor(s) and fragments thereof used to form the deposited layer may have relatively low sticking coefficients, thereby enabling the precursors to penetrate deep into the etched features. In some cases, the sticking coefficient of the precursors (at the relevant deposition conditions) may be about 0.05 or less, for example about 0.001 or less. Similarly, the precursor(s) and fragments thereof used to form the deposited layer may have a relatively low recombination rate. Species having low recombination rates are better able to penetrate deep into a feature while remaining reactive. The loss coefficient addresses the loss of reactant species due to both recombination and absorption on surfaces. In a number of embodiments, the loss coefficient is relatively low, such that reactant species are able to survive and penetrate deep into high aspect ratio features while remaining reactive. This allows the film to be deposited along a substantial fraction of the length/depth of the patterned or partially etched feature. In certain cases the coating may be deposited along the entire length of the feature. In various cases, the loss coefficient may be less than about 0.005.

The reaction mechanism may be cyclic (e.g., ALD) or continuous (e.g., CVD). Any method that results in the formation of the film at high aspect ratios may be used. As mentioned, ALD reactions may be particularly well suited for this purpose due to their conformality and adsorption-limited properties. However, other types of reactions may be used so long as the film is able to form at high aspect ratios to protect the sidewalls deep in a patterned/etched feature. The basic operations for ALD and CVD reactions are described above in relation to operation 205 of FIG. 2A. Briefly, ALD reactions involve cyclically performing the following operations: (a) delivery of a first reactant to form an adsorbed precursor layer, (b) an optional purge operation to remove the first reactant from the reaction chamber, (c) delivery of a second reactant, and reaction between the first and second reactants on the substrate, (d) optional purge to remove excess reactant, and (e) repeating (a)-(d) until the film reaches a desired thickness. Because the reactants are provided at separate times and the reaction is a surface reaction, the method may be adsorption limited to some degree. This results in the formation of very conformal films that can line entire recessed features. By contrast, CVD methods typically involve gas phase reactions where reactant(s) are delivered to the substrate in a continuous (non-cyclic) manner. Some CVD methods can be carried out with a relatively high degree of conformality.

The following reaction conditions may be used in certain embodiments where the deposition reaction occurs through plasma assisted ALD methods. The substrate temperature may be maintained between about 0-500° C., for example between about 20-200° C. The pressure may be maintained as low as about 100 or 200 mTorr and as high as about 1, 2, or 3 Torr. The ion energy may be relatively low, for example below about 1 kV. The RF frequency used to generate the plasma may be about 60 MHz, though other frequencies may also be used. The RF power may be a few hundred Watts, for example about 500 W or less (e.g., about 7100 W/m$^2$ or less), about 400 W or less (e.g., about 7100 W/m$^2$ or less), or about 300 W or less (e.g., about 7100 W/m$^2$ or less). The reported power levels herein assume that the power is delivered to a single 300 mm wafer, the power scaling linearly based on substrate area for additional or differently sized substrates. During each ALD cycle, the adsorbing reactant may be delivered for a duration between about 0.5-20 seconds, at a flow rate between about 50-1000 sccm. The first purge may have a duration between about 0-60 seconds. The plasma may be exposed to the substrate for a duration between about 0.5-120 seconds, with a flow rate of a reactant (excluding any inert gas provided along with the reactant) between about 50-1000 sccm. A flow rate of hydrogen during the plasma exposure may be between about 0-1000 sccm. The post-RF purge may have a duration between about 0-60 seconds.

The following reaction conditions may be used in various embodiments where the deposition reaction occurs through thermal (non-plasma) ALD methods. The substrate temperature may be maintained between about 150-500° C., for example between about 250-400° C. The pressure may be maintained as low as about 100 or 200 mTorr, and as high as about 1, 2 or 3 Torr. During each ALD cycle, the adsorbing reactant may be delivered for a duration between about 0.15-20 seconds, at a flow rate between about 50-1000 sccm. The first purge may have a duration between about 0-60 seconds. The plasma may be exposed to the substrate for a duration between about 0.15-120 seconds, with a flow rate of a reactant (excluding any inert gas provided along with the reactant) between about 50-1000 sccm. The second purge may have a duration between about 0-60 seconds.

The following reaction conditions may be used in certain embodiments where the deposition reaction occurs through plasma assisted CVD methods. The substrate temperature may be maintained between about 0-500° C., for example between about 20-200° C. The pressure may be maintained between about 100-3000 mT. The RF frequency used to generate the plasma may be 2-60 MHz. The RF power used to generate the plasma may be between about 50-2000 W (e.g. between about 700-28,000 W/m$^2$), for example between about 100-800 W (e.g., between about 1,400-11,300 W/m$^2$). The duration of the reactant delivery and plasma exposure may be between about 1-180 seconds. The flow rates depend on the particular reactants.

The following reaction conditions may be used in certain embodiments where the deposition reaction occurs through thermal (non-plasma) CVD methods. The substrate temperature may be maintained between about −10-500° C., for example between about 20-300° C. The pressure may be maintained between about 100-3000 mT. The duration of the reactant delivery may be between about 1-180 seconds. The flow rates depend on the particular reactants. The ALD and CVD reaction conditions are provided as guidance and are not intended to be limiting.

Certain metal-containing films may be particularly well suited for deposition through CVD methods. Such films may be formed with a relatively high degree of conformality compared to many other CVD-deposited films. Examples of metal-containing films that can be deposited conformally include iron boride (Fe$_x$B$_y$, e.g., FeB and Fe$_2$B), hafnium diboride (HfB$_2$), and titanium diboride (TiB$_2$). Such films are further described in the following publications, each of which is incorporated by reference in its entirety: Highly conformal film growth by chemical vapor deposition. II. Conformality enhancement through growth inhibition, A. Yanguas-Gil, et al., J. Vac. Sci. Technol. A 27, 1244 (2009); and CVD Growth Kinetics of HfB$_2$ Thin Films from the Single-Source Precursor Hf(BH$_4$)$_4$, Yu Yang, et al., Chem. Mater., 2006, 18, 5088-5096.

In certain embodiments where plasma is used, the plasma may be a capacitively coupled plasma. In some other embodiments, the plasma may be an inductively coupled plasma, a remotely generated plasma, a microwave plasma, etc. In some implementations, the plasma is a capacitively coupled plasma generated at one or more frequencies as mentioned above. The frequency or frequencies used to generate the plasma may include low frequency (LF) components and/or high frequency (HF) components. In some cases only HF frequencies are used during particular processing steps where plasma is present.

VII. Apparatus

The methods described herein may be performed by any suitable apparatus or combination of apparatus. A suitable apparatus includes hardware for accomplishing the process operations and a system controller having instructions for controlling process operations in accordance with the present invention. For example, in some embodiments, the hardware may include one or more process stations included in a process tool. One process station may be an etching station and another process station may be a deposition station. In another embodiment, etching and deposition occur in a single station/chamber. In yet another embodiment, multiple etching stations and/or multiple deposition stations may be included in a single process tool.

Figure 4A:
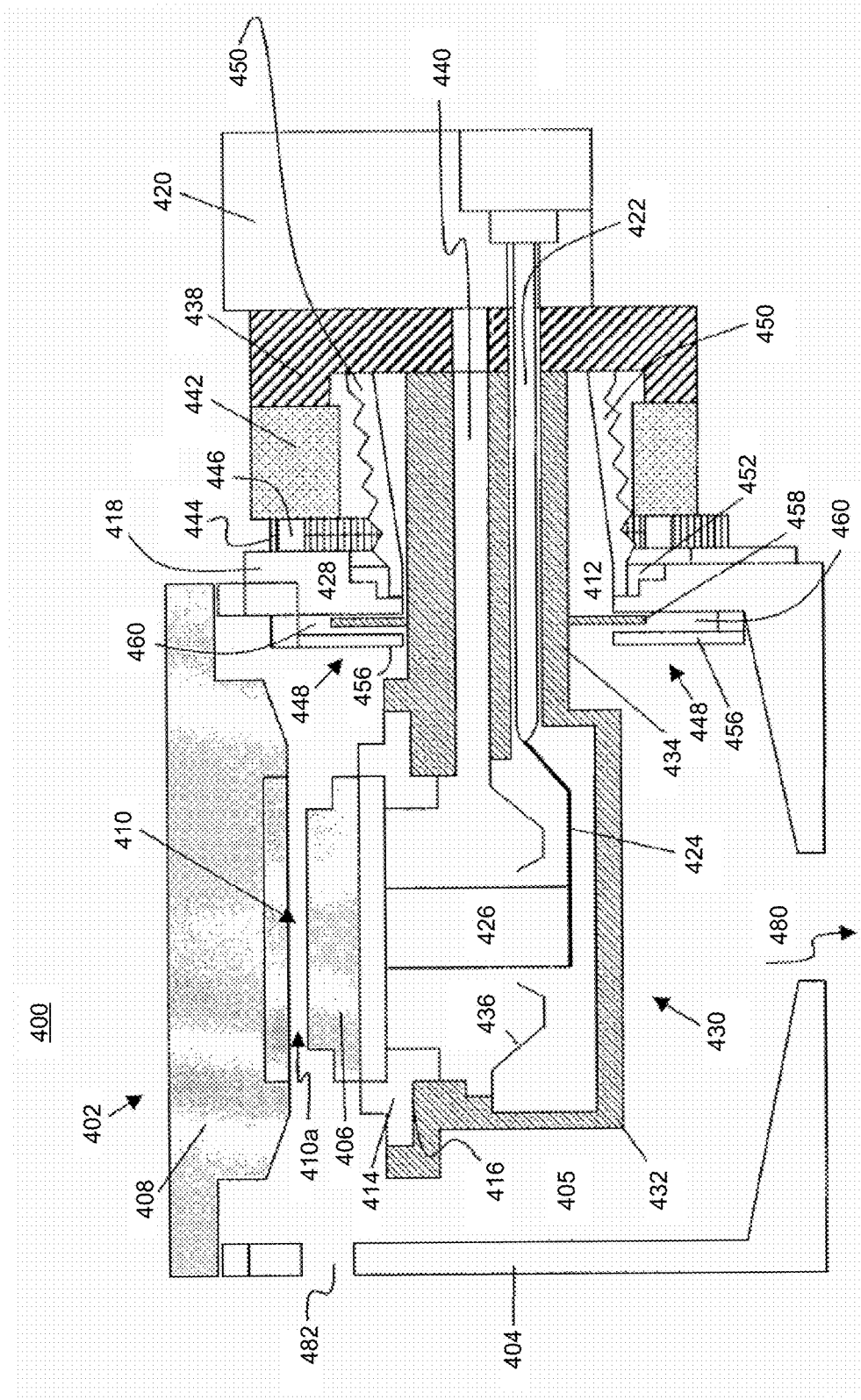
FIGS. 4A-4C illustrate a reaction chamber that may be used to perform the etching processes described herein according to certain embodiments.
Figure 4B:
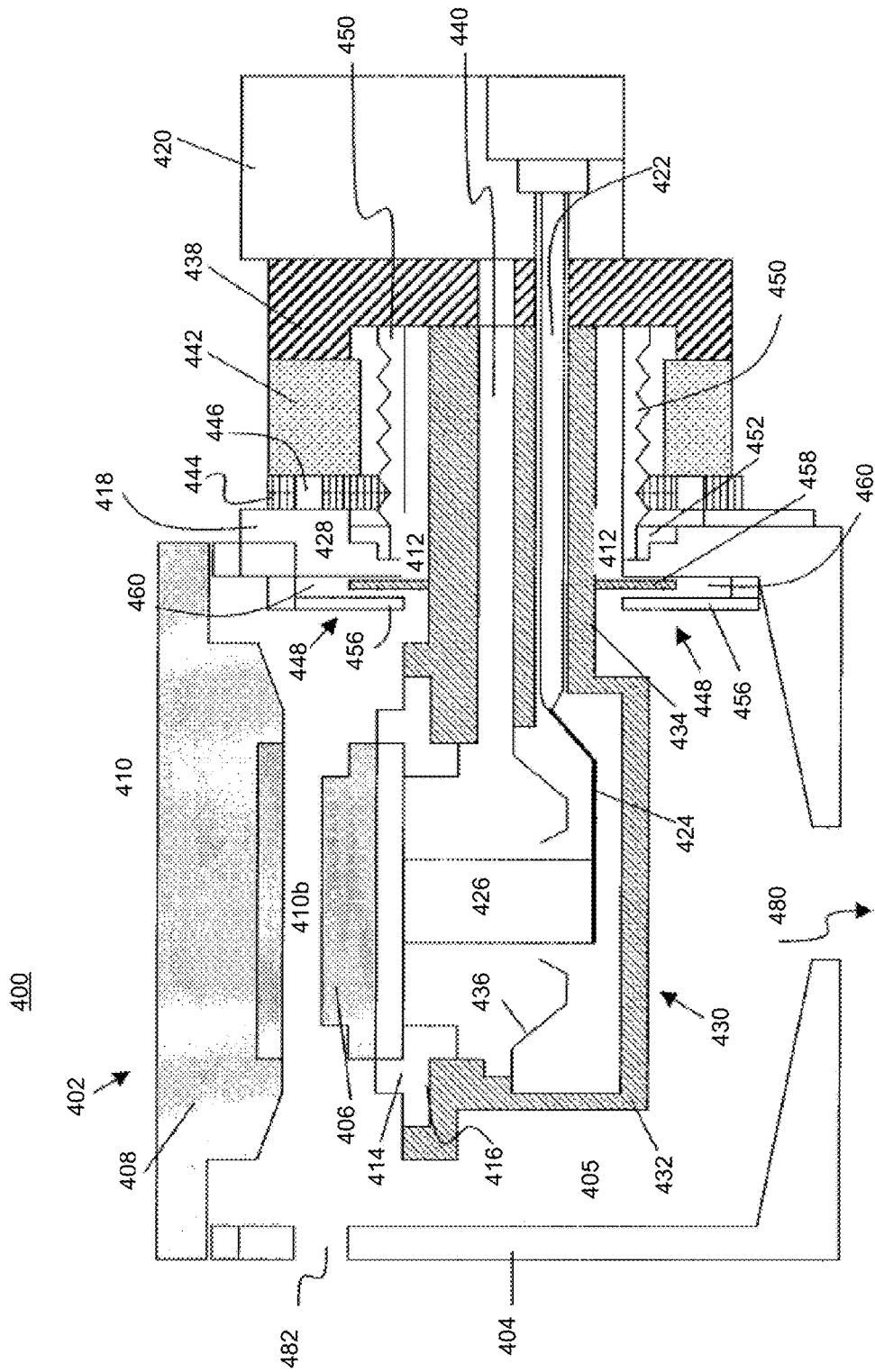
Figure 4C:
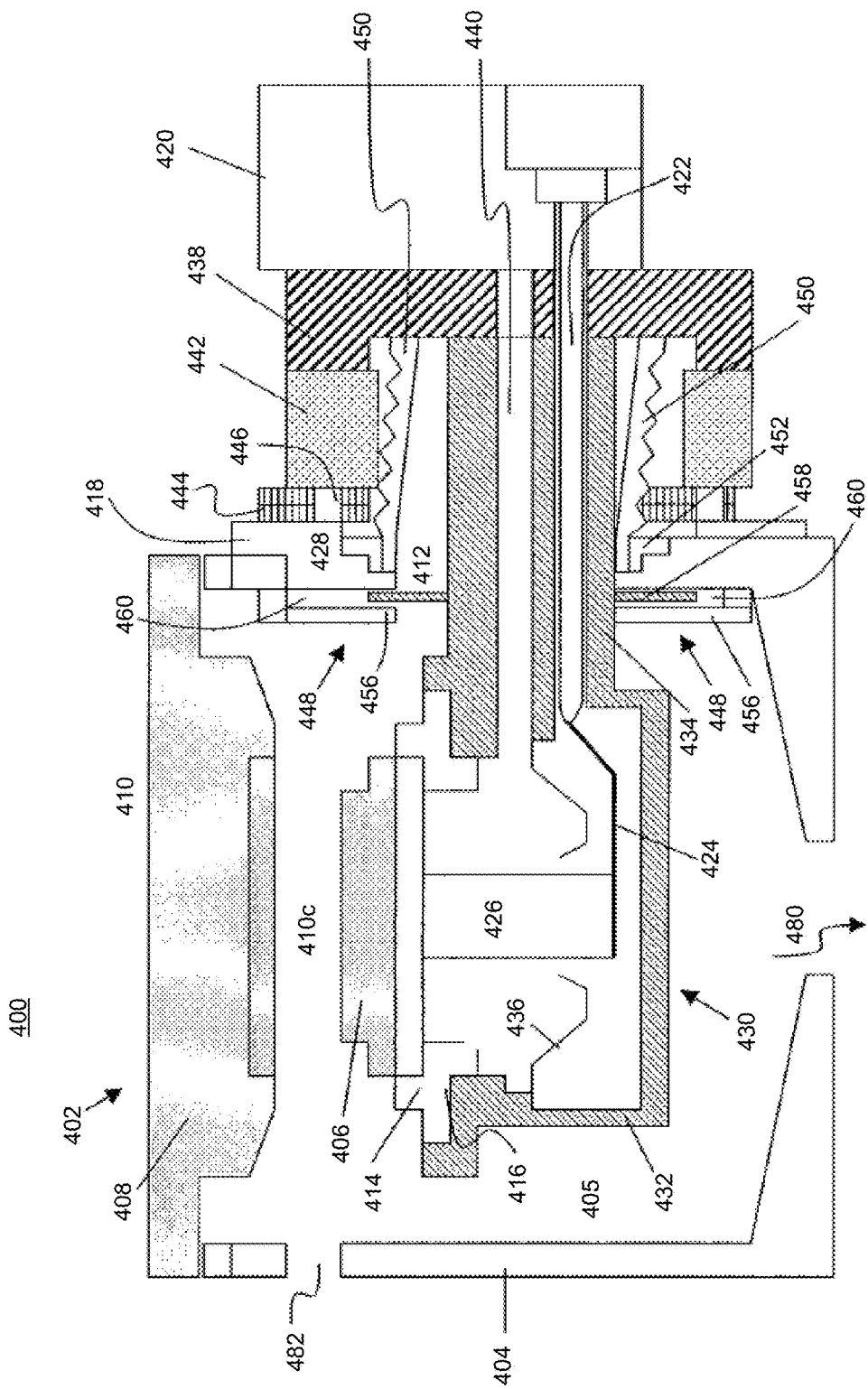

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthogonal to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. As described in commonly-owned U.S. Pat. No. 7,732,728, the entire contents of which are herein incorporated by reference, a wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. Further details of the facility components are described in U.S. Pat. Nos. 5,948,704 and 7,732,728 and are not shown here for simplicity of description. The gap 410 is preferably surrounded by a confinement ring assembly or shroud (not shown), details of which can be found in commonly owned published U.S. Pat. No. 7,740,736 herein incorporated by reference. The interior of the vacuum chamber 402 is maintained at a low pressure by connection to a vacuum pump through vacuum portal 480.

The conduit support plate 438 is attached to an actuation mechanism 442. Details of an actuation mechanism are described in commonly-owned U.S. Pat. No. 7,732,728 incorporated herein by above. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410 a. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410 b.

FIG. 4C illustrates a large gap 410 c when the actuation mechanism 442 is at a low position on the linear bearing. Preferably, the upper and lower electrodes 408, 406 remain coaxial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 *a*). FIG. 4C shows the movable shield plate 458 at a lower position in the labyrinth groove 460 above the RF bias housing arm 434 when the cantilevered assembly is in a low position (large gap 410 *c*). FIG. 4B shows the movable shield plate 458 in a neutral or mid position within the labyrinth groove 460 when the cantilevered assembly is in a mid position (medium gap 410 *b*). While the labyrinth seal 448 is shown as symmetrical about the RF bias housing arm 434, in other embodiments the labyrinth seal 448 may be asymmetrical about the RF bias arm 434.

Figure 5:
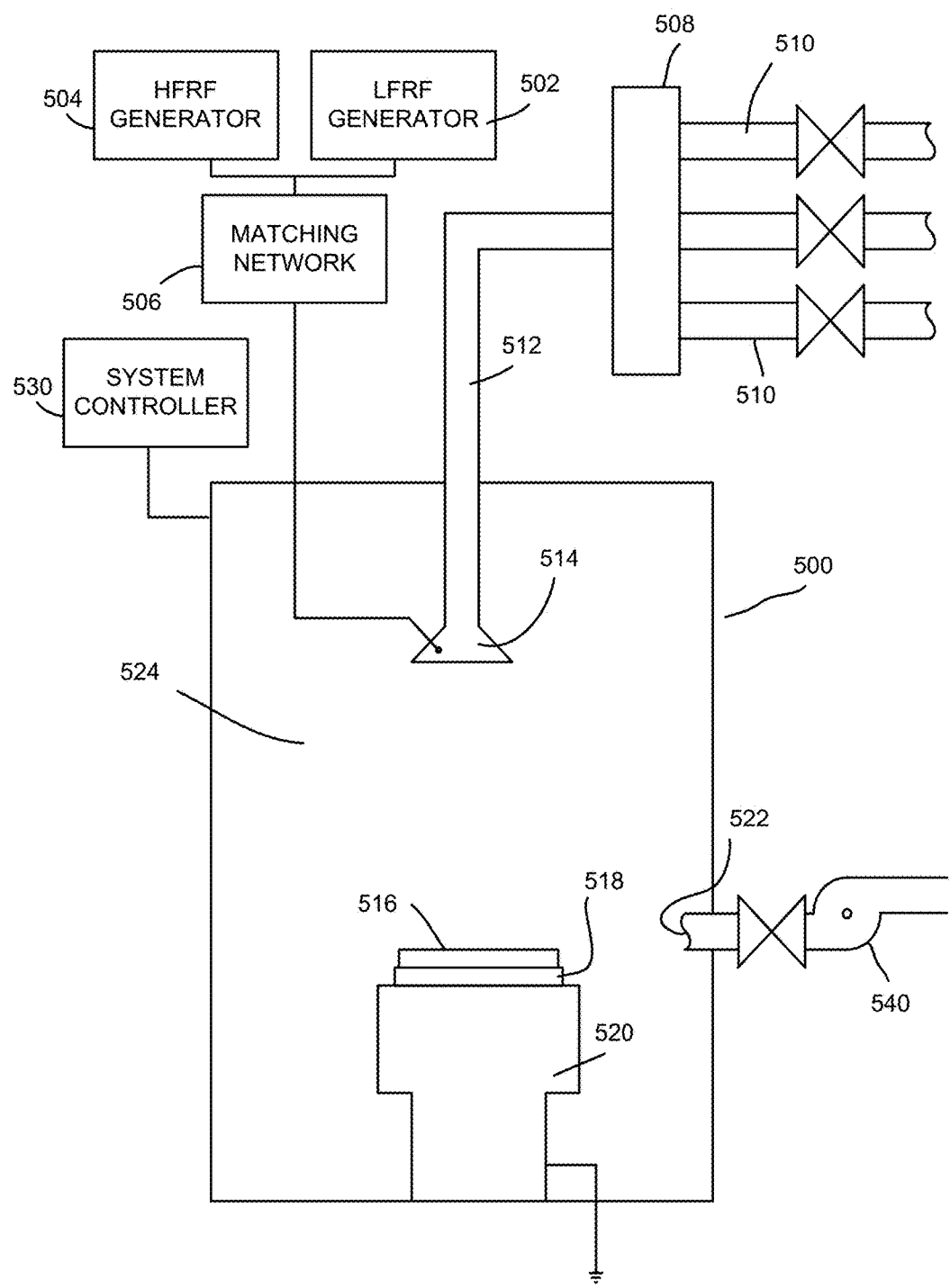
FIG. 5 depicts a reaction chamber that may be used to perform the deposition processes described herein according to certain embodiments.

FIG. 5 provides a simple block diagram depicting various reactor components arranged for implementing various deposition methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 50 W to 500 W (e.g., 700 to 7,100 W/m$^2$) of HFRF power. In some examples, the matching network 506 may provide 100 W to 5000 W (e.g., 1,400 to 71,000 W/m$^2$) of HFRF power and 100 W to 5000 W (e.g., 1,400 to 71,000 W/m$^2$) of LFRF power total energy. In a typical process, the HFRF component may generally be between 5 MHz to 60 MHz, e.g., 13.56 MHz, about 27 MHz, or about 60 MHz in some cases. In operations where there is an LF component, the LF component may be from about 100 kHz to 2 MHz, e.g., about 430 kHz or about 2 MHz in some cases.

Within the reactor, a wafer pedestal 518 may support a substrate 516. The wafer pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching operations if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 6:
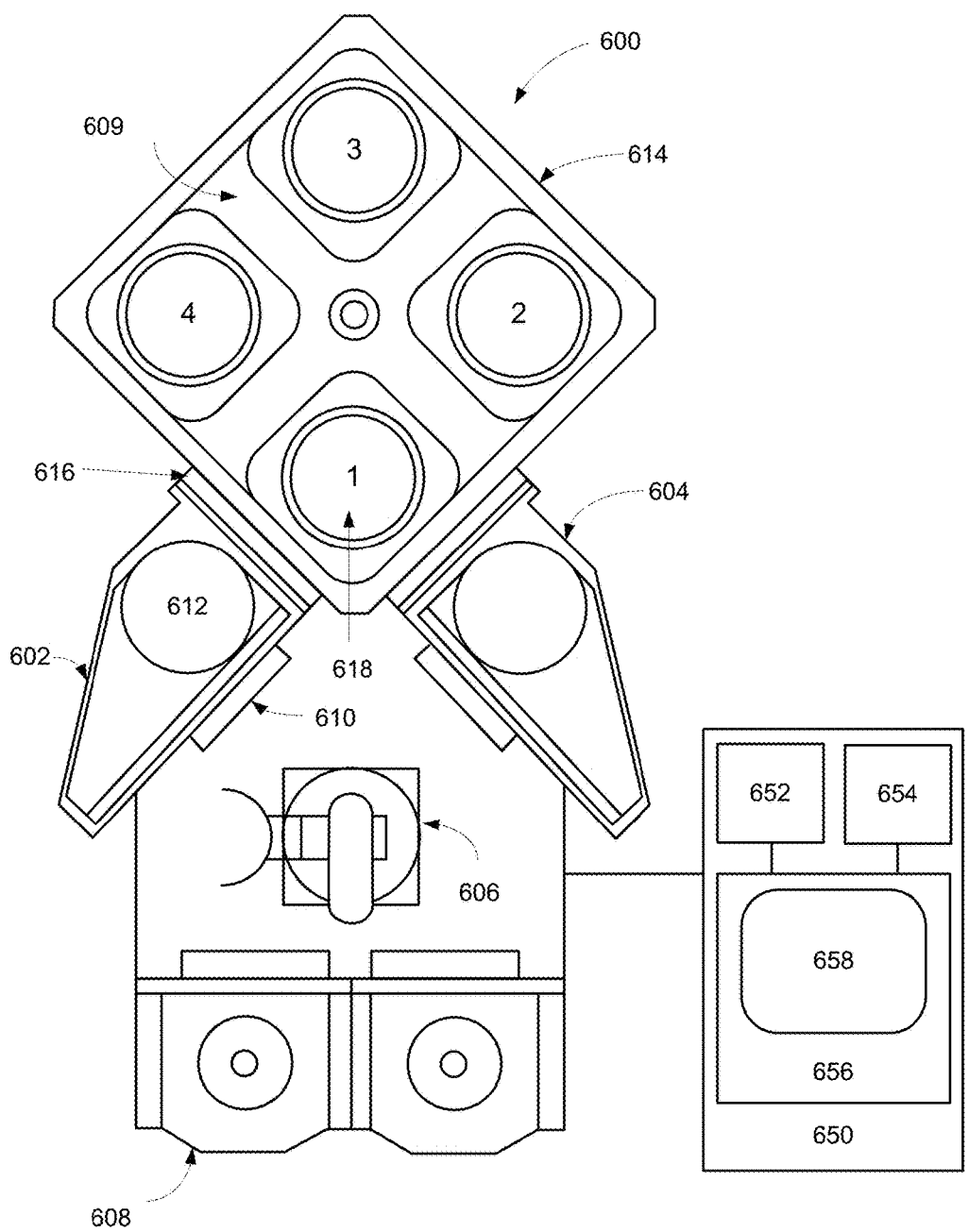
FIG. 6 shows a multi-station apparatus that may be used to perform the deposition processes in certain implementations.

One or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, each of the process stations 1-4 may be a chamber for performing one or more of ALD, CVD, CFD, or etching (any of which may be plasma assisted). In one embodiment, at least one of the process stations is a deposition station having a reaction chamber as shown in FIG. 5, and at least one of the other process stations is an etching station having a reaction chamber as shown in FIGS. 4A-4C. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 690 for transferring wafers within processing chamber 614. In some embodiments, wafer handling system 690 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In certain embodiments, the controller has instructions to perform the operations shown and described in relation to FIG. 1E. For example, the controller may have instructions to (a) deposit a mask shrink layer on a patterned mask layer, (b) remove the mask shrink layer at the bottom of patterned features, and (c) etch the features into the dielectric-containing material below the patterned mask layer. In some other embodiments, the controller has instructions to perform the operations shown and described in relation to FIG. 2A. For example, the controller may have further instructions to perform the etching operation cyclically with the protective sidewall coating deposition operation. The instructions may relate to performing these processes using the disclosed reaction conditions. The instructions may also relate to transferring the substrate between different processing chambers (e.g., between etching and deposition chambers, between etching chambers, and/or between deposition chambers) in some implementations.

Returning to the embodiment of FIG. 6, in some embodiments, system controller 650 controls all of the activities of process tool 600. System controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a ALD process may include one or more instructions for execution by system controller 650. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition or etching in order to stabilize the pressure in the process station. In some implementations, the controller includes instructions for (a) depositing a mask shrink layer, (b) punching through/removing the mask shrink layer at the bottom of recessed features, and (c) etching the features into the dielectric-containing material, including appropriate instructions regarding the flow of various process gases. In some such embodiments, the controller includes instructions for cyclically (a) etching the features into the dielectric-containing material, and (b) depositing a metal-containing protective layer on sidewalls of the partially etched features, including appropriate instructions regarding flow of various process gasses.

A pressure control program may include code for controlling the pressure in the process station by regulating, for example, a throttle valve in the exhaust system of the process station, a gas flow into the process station, etc. In some embodiments, a pressure control program may include instructions for maintaining the reaction chamber(s) at appropriate pressure levels during the various stages of the etching/deposition methods as described herein.

A heater control program may include code for controlling the current to a heating unit that is used to heat the substrate. Alternatively, the heater control program may control delivery of a heat transfer gas (such as helium) to the substrate. In certain implementations, the controller includes instructions for etching the substrate and depositing film on the substrate using the temperatures described herein.

A plasma control program may include code for setting RF power levels and exposure times in one or more process stations in accordance with the embodiments herein. In some embodiments, the controller includes instructions for controlling plasma characteristics during etching and/or deposition of a metal-containing protective sidewall coating. The instructions may relate to appropriate power levels, frequencies, duty cycles, etc.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 7:
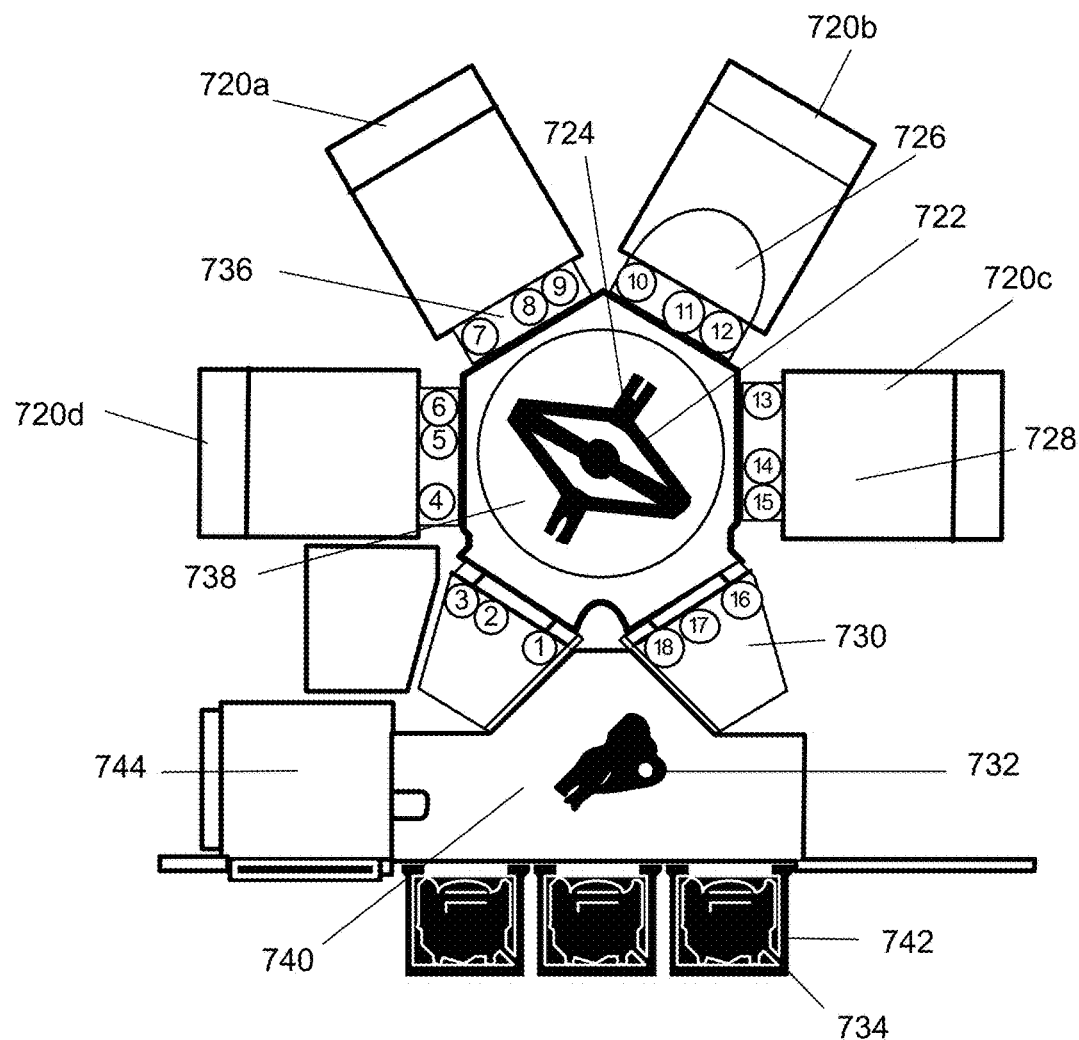
FIG. 7 presents a cluster tool that may be used to practice both deposition and etching according to certain embodiments.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates, depositing protective films (or sub-layers therein) on sidewalls of recessed features, and other suitable functions in accordance with the disclosed embodiments. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

In one example, processing module 720a may be configured for etching and processing module 720b may be configured for deposition. In another example, processing module 720a may be configured for etching, processing module 720b may be configured to deposit a first sub-layer (e.g., of the protective sidewall coating or the mask shrink layer), and processing module 720c may be configured to deposit a second sub-layer (e.g., of the protective sidewall coating or the mask shrink layer).

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes etching as described herein to form a partially etched feature. Next, the robot 722 moves the substrate out of processing module 720a, into the VTM 738, and then into a different processing module 720b. In processing module 720b, a protective film is deposited on sidewalls of the partially etched feature. Then, the robot 722 moves the substrate out of processing module 720b, into the VTM 738, and into processing module 720a, where the partially etched feature is further etched. The etching/deposition can be repeated until the feature is fully etched.

It should be noted that the computer controlling the substrate movement can be local to the cluster architecture, or can be located external to the cluster architecture in the manufacturing floor, or in a remote location and connected to the cluster architecture via a network.

Lithographic patterning of a film typically comprises some or all of the following operations, each operation enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

VIII. Experimental

Various experimental results have shown that the disclosed methods may be used to etch high quality features into substrates, even at very high aspect ratios. The results show that metal-containing films effectively act as mask shrink layers and provide particularly good sidewall protection during the etch stages, resulting in etched features that have smaller and more uniform critical dimensions throughout the feature. Further, the features etched using a metal-containing protective sidewall coating showed improved vertical etch rates compared to other kinds of sidewall passivation films that have been used.

Figure 8A:
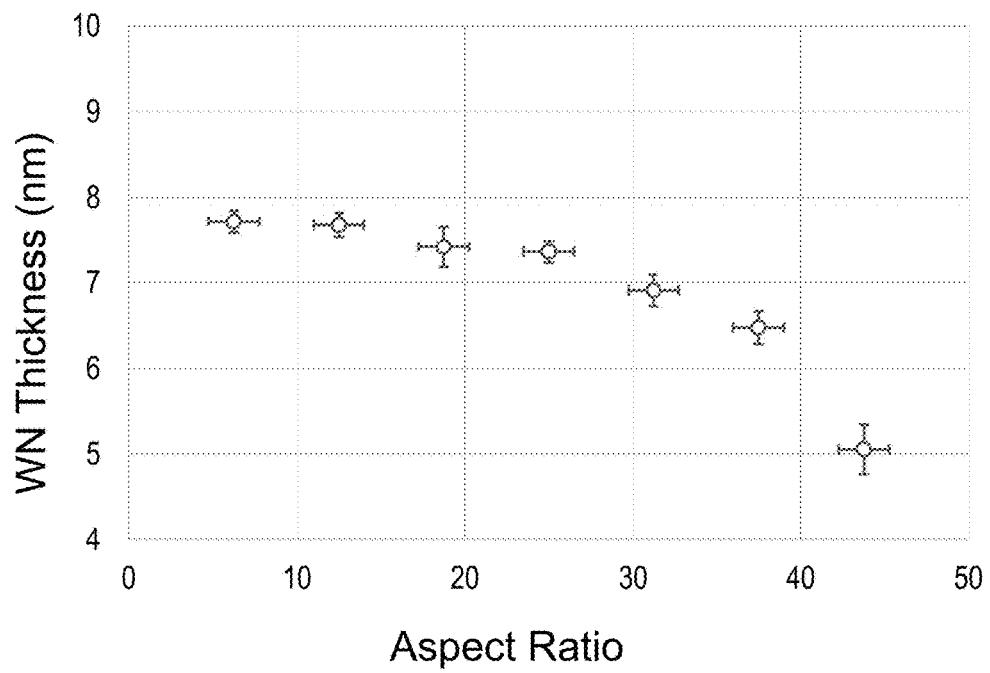
FIG. 8A shows experimental results illustrating the thickness of a tungsten nitride protective sidewall coating at different aspect ratios within a feature.

FIG. 8A presents experimental results related to a cyclic etching method involving (a) partially etching features, and (b) deposition of a tungsten nitride (WN) protective sidewall coating, for example as laid out in relation to FIG. 2A. In this experiment, the WN sidewall coating was deposited using thermal ALD techniques. The WN was deposited by cyclically exposing the substrate to different reactants while maintaining the substrate at a temperature of about 300° C. and a pressure of about 3 Torr. The etching operations were carried out in a reaction chamber from the FLEX™ Product Family and the deposition operations were carried out in a DirectFill™ Max reaction chamber from the ALTUS® Product Family, both available from Lam Research Corporation of Fremont, Calif.

The results in FIG. 8A show that the WN protective sidewall coating can be deposited with a reasonable degree of conformality, even at very high aspect ratios. While the results in FIG. 8A were produced without depositing a mask shrink layer, these results suggest that WN can be deposited with sufficient conformality to act as a mask shrink layer (when deposited at the appropriate point in the process, as shown in FIGS. 1E and 2A). For example, at an aspect ratio of about 7, the sidewall thickness was between about 7 and 8 nm. The sidewall thickness did not drop below about 7 nm until the aspect ratio reached about 30. Even at an aspect ratio as high as about 44, the sidewall thickness was still above 5 nm. In other words, although the sidewall coating was not perfectly conformal, it was surprisingly conformal at high aspect ratios. Various other materials that have previously been used as sidewall coatings (e.g., silicon oxide, silicon boride, organic polymers, etc.) have generally shown less conformality, particularly at high aspect ratios. Without wishing to be bound by theory or mechanism of action, it is believed that metal-containing protective sidewall coatings promote superior etch results compared to previously used materials. The improved results may arise from one or more of a variety of factors including, but not limited to, greater degree of conformality, increased conductivity and reduced charging effects within features, higher resistance of the protective sidewall coating to the etch process, and/or modification of surface chemical reactivity and catalysis on the sidewalls of the partially etched features.

Figure 8B:
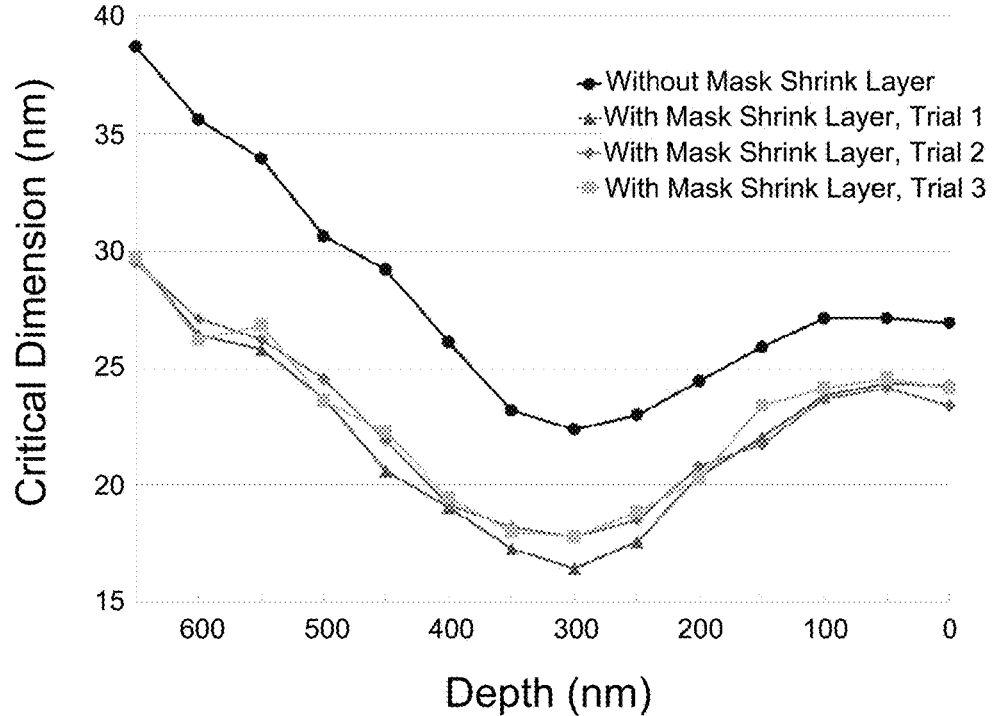
FIG. 8B presents experimental results showing the critical dimension vs. depth for features patterned into a mask layer, with and without deposition of a mask shrink layer.

FIG. 8B is a graph depicting critical dimension vs. depth for several different test substrates. The data in FIG. 8B were collected after deposition and patterning of a polysilicon mask layer, and before any features were etched into dielectric-containing material positioned below the mask layer. The depth referred to in the x-axis is measured as the distance from the top of the mask layer. It is common for mask layers in memory applications to be on the order of about 600-700 nm, as shown in FIG. 8B. One substrate tested did not have any mask shrink layer thereon. This substrate is shown with the circle-shaped data points. The other three substrates tested had a tungsten nitride mask shrink layer deposited thereon. The mask shrink layer was deposited using thermally driven atomic layer deposition. The mask shrink layer deposited conformally over the patterned mask layer, thereby shrinking the critical dimension at all points within the patterned features. All three substrates that included the tungsten nitride mask shrink layer showed similar results. The mask shrink layers were formed at a thickness of about 2-3 nm. Since the film deposits on opposing sidewalls within the patterned features, the critical dimension of such features was reduced by twice the film thickness. Overall, the use of the mask shrink layer reduced the critical dimension of the features by about 4-6 nm.

A related benefit shown in FIG. 8B is that deposition of the mask shrink layer improved the vertical profile within the patterned features. Without deposition of any mask shrink layer, the critical dimension near the bottom of the feature was about 11 nm wider than the critical dimension near the top of the feature, a difference of about 40% (based on the CD at the top of the feature). By contrast, when a mask shrink layer is deposited, the critical dimension near the bottom of the feature was only about 6 nm wider than the critical dimension near the top of the feature, a difference of about 25%. While both cases resulted in vertical profiles that were, to some degree, non-uniform, the non-uniformities were not as substantial in cases where the mask shrink layer was deposited. These results suggest that the mask shrink layer can be deposited in a manner that compensates for non-uniform/non-vertical profiles within a patterned mask layer.

In a related embodiment, a mask layer may include patterned features that have a relatively larger critical dimension near the top of the patterned features and a relatively smaller critical dimension near the bottom of the patterned features. Such differences in critical dimension may arise as a result of the lithography/pattern transfer operations used to pattern the mask layer. In such embodiments, the mask shrink layer may be deposited such that it forms relatively thinner toward the bottom of the patterned features and relatively thicker near the top of the patterned features. This non-uniformity in deposition of the mask shrink layer may compensate for the non-uniformities present in the patterned mask layer.

Figure 8C:
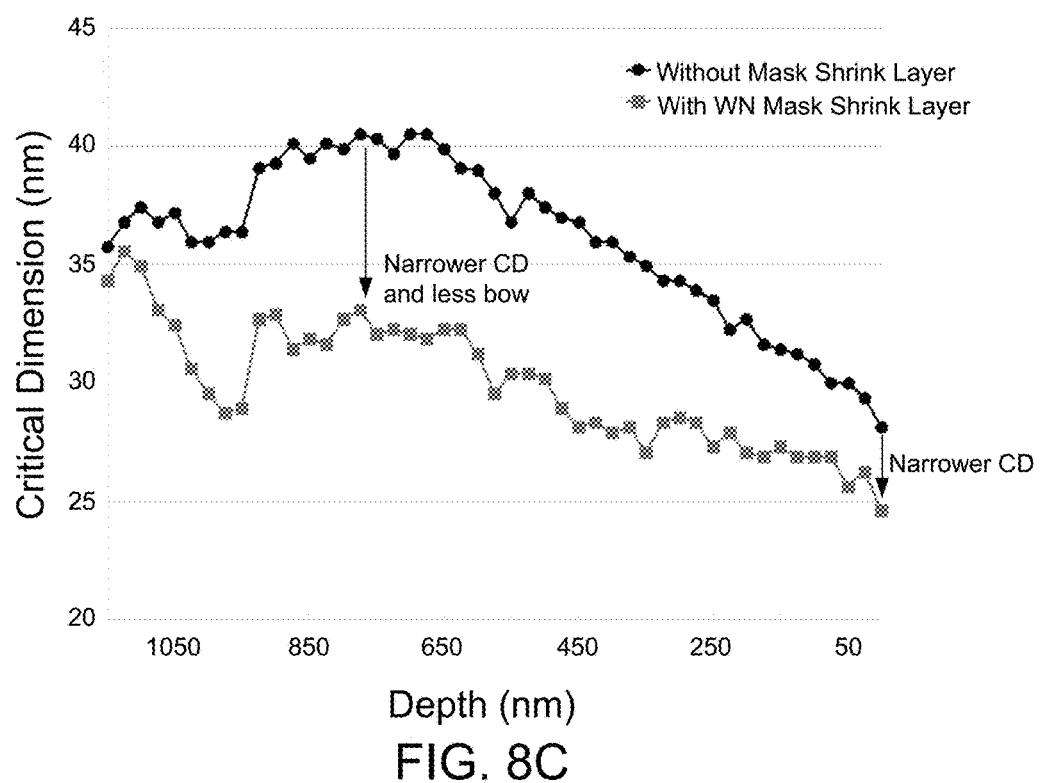
FIG. 8C illustrates experimental results showing the critical dimension vs. depth for features etched into a dielectric-containing stack, with and without deposition of a mask shrink layer.

FIG. 8C presents data showing critical dimension vs. depth for features etched into dielectric-containing material with a patterned polysilicon mask layer thereon. In FIG. 8C, the features were etched into the dielectric-containing material in a single etching operation. No protective sidewall coating was deposited after the etching was initiated. Results for two test substrates are shown in FIG. 8C. One test substrate was etched after deposition of a tungsten nitride mask shrink layer on the patterned mask layer, while the other substrate was etched without ever depositing a mask shrink layer. In the case where the mask shrink layer was used, a punch through step was performed, as described above, to break through the mask shrink layer at the bottom of the patterned features. The substrate that included the mask shrink layer had features with narrower critical dimensions than the features on the substrate that did not include a mask shrink layer. On average within the feature, deposition of the mask shrink layer resulted in about a 7 nm decrease in critical dimension.

Surprisingly, this reduction in critical dimension was not uniform throughout the etched feature. The reduction in critical dimension was greatest at the region where (without any mask shrink layer) the bow was most severe. In other words, the mask shrink layer not only resulted in etched features having reduced critical dimension, it also resulted in etched features having a more uniform critical dimension, such that there was substantially less bowing. The results in FIG. 8C make it clear that the mask shrink layer can be used to etch high aspect ratio features at narrower critical dimensions than can be achieved without deposition of a mask shrink layer. Narrower features are beneficial at least because the remaining (non-etched) material is more structurally sound, and because narrower (more separated) features present a lower risk of current leakage and/or parasitic capacitive coupling between adjacent cells.

Figure 9A:
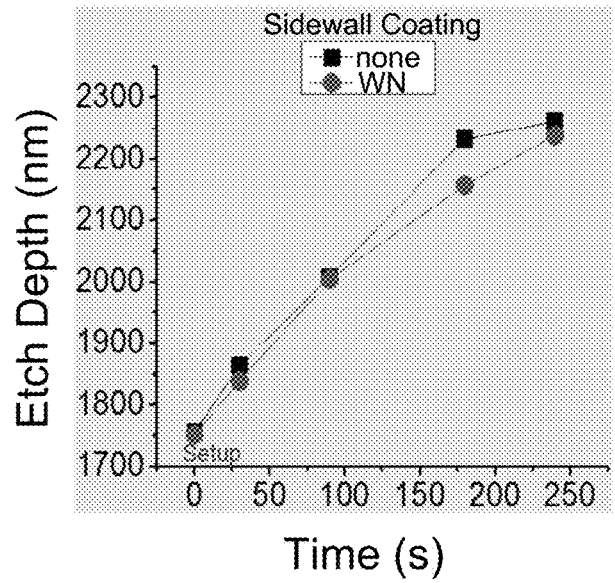
FIG. 9A presents experimental results showing the etch depth vs. time using different methods to etch the features.
Figure 9B:
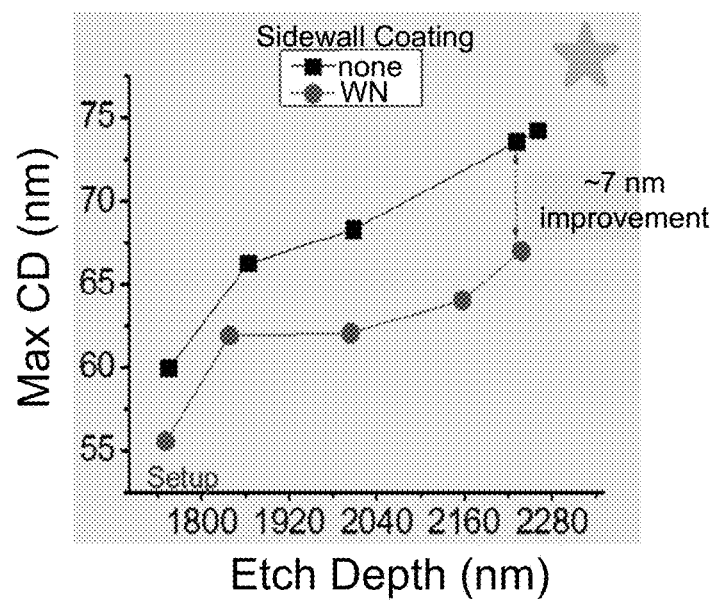
FIG. 9B presents experimental results showing the maximum critical dimension achieved for various etch depths using different methods to etch the features.

FIGS. 9A and 9B illustrate experimental results comparing two etching methods. In a first etching method, the features were etched in a cyclic process that involved (a) partially etching the features, and (b) depositing a tungsten nitride protective sidewall coating within the features. In a second etching method, the features were etched without depositing any protective sidewall coatings. In the first method, the etching and deposition operations were carried out in separate reaction chambers, and the test substrate was moved back and forth between the reaction chambers as needed. In the second method, the test substrate was moved/transferred in a similar fashion to the first method, but no deposition was ever done on the test substrate. This movement, while not essential to performing the second method, helps ensure that the test substrates were exposed to similar conditions such that the comparison of results from the two methods represents only the effect of the deposition. In both etching methods, the features were etched without depositing a mask shrink layer.

FIG. 9A shows the etch depth vs. time for the two methods. While the etching rates were similar, the method involving deposition of a WN protective sidewall coating showed a somewhat higher etch rate compared to the method that did not involve deposition of any sidewall coating. Similar results have corroborated that metal-containing protective sidewall coatings can be used to achieve higher etching rates.

FIG. 9B shows the maximum CD vs. the etch depth, for a series of tests with different etch times. The maximum CD is measured as the critical dimension at the widest portion of the feature (the bow). For example, a partially etched feature that is 1000 nm deep and 50 nm wide at its widest portion has a maximum CD of about 50 nm. After further etching, this same feature may be about 1500 nm deep, and about 70 nm wide at its widest portion. At this etch depth (1500 nm), the feature has a maximum CD of 70 nm. These values are provided as context for understanding what is shown in FIG. 9B. The maximum CD is shown at different etch depths. The different etch depths are achieved over time (and on different test substrates) as the feature is etched further into the substrate.

The results in FIG. 9B show that where no sidewall coating was deposited, the max CD was about 74 nm, and that where a WN sidewall coating was used, the max CD was only about 67 nm (at the final etch depth). These results suggest that the WN sidewall coating provided improved resistance to lateral etch during the etching operation. This improved etch resistance reduces the likelihood that a portion of the feature will be laterally etched to an excessive degree to form a bow. Further, the results suggest that any bow that develops will be less severe in cases where sidewall protection is periodically deposited.

Figure 10:
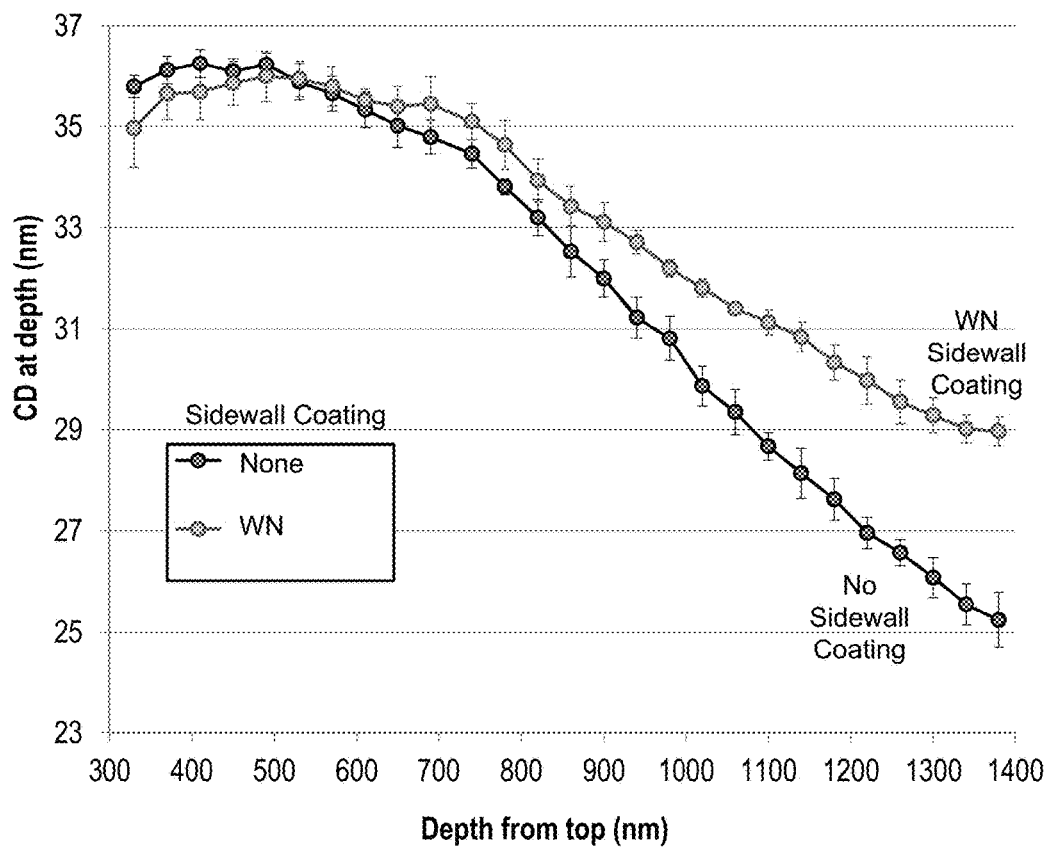
FIG. 10 illustrates experimental results showing the critical dimension vs. depth in a feature using different methods to etch the features.

FIG. 10 illustrates the critical dimension vs. depth, for a single process test, for features deposited according to the two methods described in relation to FIGS. 9A and 9B. In a first method, a tungsten nitride protective sidewall coating was applied after a partial etch, and etching continued after deposition of the tungsten nitride protective sidewall coating. In a second method, the features were etched without depositing any protective sidewall coating. No mask shrink layer was deposited in either method. The critical dimension on the y-axis of FIG. 10 corresponds to the critical dimension at the corresponding depth shown on the x-axis. This contrasts with the maximum critical dimension shown for various etch depths in FIG. 9B, which corresponds to the maximum critical dimension achieved anywhere in the feature when the feature is etched to the depth shown on the x-axis of FIG. 9B. The results in FIG. 10 show that the feature has a more uniform critical dimension throughout its depth where a tungsten nitride protective sidewall coating is periodically deposited, compared to cases where no such sidewall protection is deposited.

Where no sidewall protection is provided, the critical dimension of the features ranges from about 25.2 nm at the narrowest portion of the feature (the feature bottom) to about 36.2 nm at the widest portion of the feature (about 400 nm from the top of the feature), representing a bow of about 11 nm. Where a WN sidewall coating was periodically deposited, the critical dimension of the features ranged from about 29.0 nm at the narrowest portion of the feature (the feature bottom) to about 36.0 nm at the widest portion of the feature (about 500 nm from the top of the feature), representing a bow of about 7 nm. Periodic deposition of a tungsten nitride protective sidewall coating therefore reduced the degree of bow on the features from about 11 nm to about 7 nm, a reduction of about 36%. Further, deposition of the tungsten nitride protective sidewall coating resulted in a larger critical dimension at the bottom of the feature after etching was complete. When etching high aspect ratio features, the critical dimension at the bottom of the feature is often undesirably small compared to the average critical dimension within the feature. Deposition of the tungsten nitride protective sidewall coating reduced this effect, resulting in a relatively larger critical dimension at the bottom of the feature (compared to cases where no sidewall protection was used), which overall results in a feature having a more uniform critical dimension.

The experimental results suggest that deposition of a mask shrink layer results in etched features having narrower critical dimensions overall, and a lower degree of bowing. In addition, the degree of bowing can be reduced by periodically depositing a protective sidewall coating on the sidewalls of partially etched features. These techniques may be combined, as desired, for a particular application.

What is claimed is:
1. A method of forming an etched feature in a dielectric-containing stack on a semiconductor substrate, the method comprising:
(a) receiving a substrate comprising the dielectric-containing stack and a mask layer positioned over the dielectric-containing stack, the mask layer including a pattern comprising openings in the mask layer;
(b) depositing a mask shrink layer on the mask layer, wherein the mask shrink layer is formed through a vapor deposition process and comprises a metal layer in substantially elemental form, and wherein the mask shrink layer lines the openings in the mask layer;
(c) generating an etching plasma comprising an etching reactant, exposing the substrate to the etching plasma, and etching the feature in the dielectric-containing stack, wherein the feature has an aspect ratio of about 5 or greater at its final depth.

2. The method of claim 1, wherein the mask shrink layer is a bilayer that comprises the metal layer in substantially elemental form and a layer selected from the group consisting of a metal nitride layer, a metal oxide layer, a metal carbide layer, a metal boride layer and a combination thereof.

3. The method of claim 1, wherein a metal in the metal layer of the mask shrink layer is selected from the group consisting of tungsten, titanium, tantalum, ruthenium, aluminum, iron, hafnium, and combinations thereof.

4. The method of claim 2, wherein the mask shrink layer comprises the metal nitride layer.

5. The method of claim 1, wherein (c) comprises at least a first phase and a second phase, wherein the first phase is performed under conditions that result in etching through the mask shrink layer at the bottom of the openings in mask layer, and wherein the second phase is performed under conditions that result in etching through the dielectric-containing stack.

6. The method of claim 1, wherein (b) comprises depositing the mask shrink layer through an atomic layer deposition reaction comprising:
(i) exposing the substrate to a first deposition reactant and allowing the first deposition reactant to adsorb onto sidewalls of the openings in mask layer; and
(ii) after (i), exposing the substrate to a second deposition reactant and reacting the first and second deposition reactants in a surface reaction, thereby forming the mask shrink layer on the sidewalls of the openings in the mask layer.

7. The method of claim 6, wherein (b) does not involve plasma.

8. The method of claim 6, wherein (ii) further comprises exposing the substrate to a mask shrink layer deposition plasma comprising the second deposition reactant, wherein exposing the substrate to the mask shrink layer deposition plasma drives a surface reaction between the first deposition reactant and the second deposition reactant, thereby forming the mask shrink layer on the sidewalls of the openings in the mask layer.

9. The method of claim 1, wherein the mask shrink layer comprises at least a first sub-layer and a second sub-layer, the first and second sub-layers being deposited under different conditions.

10. The method of claim 9, wherein the first and second sub-layers have different compositions.

11. The method of claim 1, wherein the feature etched into the dielectric-containing stack is a cylinder, trench, or line.

12. The method of claim 1, wherein after the feature is etched to its final depth, the feature has an aspect ratio of about 20 or greater, and a bow of about 20% or less.

13. The method of claim 1, wherein the feature is formed while forming a 3D NAND device, and wherein the dielectric-containing stack comprises alternating layers of (i) an oxide material, and (ii) a nitride material or polysilicon material.

14. The method of claim 1, wherein the feature is formed while forming a DRAM device, and wherein the dielectric-containing stack comprises layers of silicon oxide and one or more layers of silicon nitride.

15. The method of claim 1, wherein (b) comprises depositing the mask shrink layer through a chemical vapor deposition reaction comprising exposing the substrate to a first deposition reactant and a second deposition reactant simultaneously.

16. The method of claim 1, wherein (c) comprises:
(i) partially etching the feature,
(ii) after (i), depositing a protective film on sidewalls of the feature, wherein the protective film is deposited along substantially the entire depth of the feature,
(iii) repeating (i) and (ii) until the feature is etched to a final depth, wherein the protective film deposited in (ii) substantially prevents lateral etch of the feature in subsequent iterations of (i).

17. The method of claim 16, wherein the protective film is deposited through a thermally driven atomic layer deposition reaction, and wherein the protective film comprises a metal-containing film.

18. The method of claim 4, wherein the mask shrink layer comprises tungsten nitride.

19. A method of forming an etched feature in a dielectric-containing stack on a semiconductor substrate, the method comprising:
(a) receiving a substrate comprising the dielectric-containing stack and a mask layer positioned over the dielectric-containing stack, the mask layer including a pattern comprising openings in the mask layer;
(b) depositing a mask shrink layer on the mask layer, wherein the mask shrink layer is formed through a vapor deposition process and comprises at least a first sub-layer and a second sub-layer, the first and second sub-layers being deposited under different conditions, and wherein the mask shrink layer comprises a metal-containing material, and wherein the mask shrink layer lines the openings in the mask layer;
(c) generating an etching plasma comprising an etching reactant, exposing the substrate to the etching plasma, and etching the feature in the dielectric-containing stack, wherein the feature has an aspect ratio of about 5 or greater at its final depth.

* * * * *